United States Patent [19]
Ohnishi

[11] Patent Number: 6,021,381
[45] Date of Patent: Feb. 1, 2000

[54] SYSTEM FOR DETECTING POWER CONSUMPTION OF INTEGRATED CIRCUIT

[75] Inventor: Mitsuhisa Ohnishi, Tenri, Japan

[73] Assignee: Sharp Kabushiki Kaisha, Osaka, Japan

[21] Appl. No.: 08/858,763

[22] Filed: May 19, 1997

[30] Foreign Application Priority Data

Jun. 5, 1996 [JP] Japan ...................................... 8-143276
Sep. 25, 1996 [JP] Japan ...................................... 8-253449

[51] Int. Cl.$^7$ .................................................. G01R 21/00
[52] U.S. Cl. ........................ 702/60; 371/57.1; 371/20.4; 365/226; 365/227
[58] Field of Search .............................. 702/60; 364/528, 364/707; 395/750; 371/57.1, 20.4; 365/226, 227

[56] References Cited

U.S. PATENT DOCUMENTS

5,544,082   8/1996   Garcia-Duarte et al. ............ 364/273.2

FOREIGN PATENT DOCUMENTS

126872/1993   5/1993   Japan .

OTHER PUBLICATIONS

Uchimura et al, "Power Consumption Estimator by Logic Simulation", The 5$^{th}$ Karuizawa Workshop on Circuits and Systems, pp. 273–277, Apr. 1992, partial translation.

M. A. Cirit, "Estimating Dynamic Power Consumption of CMOS Circuits," IEEE Int. Conf. Computer–Aided Design, pp. 534–537, Nov. 1987.

F. N. Najm, "Transition Density, A Stochastic Measure of Activity in Digital Circuits," 28th ACM/IEEE Design Automation Conference, pp. 644–649, Jun. 1991.

P. E. Landman, J. M. Rabaey, "Black–Box Capacitance Models for Architectural Power Analysis," Int. Workshop on Low Power Design, pp. 165–170, 1994.

D. Liu and C. Svensson, "Power Consumption Estimation in CMOS VLSI Chips," IEEE Journal of Solid–State Circuits, vol. 29, No. 6, pp. 663–670, Jun. 1994.

F. N. Najm, "A Survey of Power Estimation Techniques in VSLI Circuits," IEEE Trans. on Very Large Scale Integration Systems, vol. 2, No. 4, pp. 446–445, Dec. 1994.

K. Keutzer, "The Impact of CAD on the Design of Low Power Digital Circuits," IEEE Symposium on Low Power Eelctronics, pp. 42–45, 1994.

V. Tiwari, S. Malik, and P. Ashar, "Guarded Evaluation: Pushing Power Management to Logic Synthesis/Design," Symposium Proceedings of Int. Symposium on Low Power Design, pp. 221–226, 1995.

*Primary Examiner*—Thomas R. Peeso
*Attorney, Agent, or Firm*—Nixon & Vanderhye P.C.

[57] ABSTRACT

A system for detecting power consumption of an integrated circuit obtains a frequency of data holding operations, unreferred data storing operations, and unupdated data storing operations with a data holding operation frequency calculating section, an unreferred data storing operation frequency calculating section, and an unupdated data storing operation frequency calculating section based on the number of times of a signal transition from connection information of the integrated circuit and control conditions when data is referred to registers, and obtains power consumption caused by each of the operations from the number of times of the signal transition, a load capacity, and an operation voltage. In this manner, the system distinguishes, in a function design phase, between signal transitions in the designed integrated circuit that are necessary to processing and those that are not definitely necessary, and detects reducible power consumption caused by the signal transitions that are not definitely necessary. Places where improvements can be made to reduce the power consumption of the circuit can be thus detected at an earlier phase in the design process.

35 Claims, 16 Drawing Sheets

SYSTEM FOR DETECTING POWER CONSUMPTION OF INTEGRATED CIRCUIT

FIELD OF THE INVENTION

The present invention relates to design of an integrated circuit, and more particularly to a system for detecting power consumption of an integrated circuit, a method for detecting power consumption of an integrated circuit, and a storing medium f or storing a computer program for calculating power consumption of an integrated circuit, all these being used for design evaluation to facilitate reduction of power consumption of an integrated circuit.

BACKGROUND OF THE INVENTION

Power consumption of an integrated circuit at a logical circuit level can be obtained from calculation. Eq. (1) is such an example for calculating power consumption of a CMOS logical circuit (i.e., power consumption by charging and discharging of a load capacity):

$$P = \alpha f C V^2 \qquad (1)$$

where P is the power consumption, C is a load capacity (parasitic capacity), V is an operating voltage (voltage applied to a load), f is an operation frequency (switching frequency), and a is an operation ratio. Alternatively, a leak current, a transient current of a transistor, etc. are taken into account for better precision in calculation for the power consumption.

The power consumption of an integrated circuit used for, for example, a portable information terminal and a communication device is set to a small value as one of its specifications. Therefore, a designer needs to design a circuit so that the power consumption of the circuit meets that specification, that is, the set value.

FIG. 16 shows a typical design flow of an integrated circuit. In typical design of an integrated circuit, specifications are first designed for correspondence of input and output signals and power consumption of an integrated circuit as specification design. The circuit is next designed at a register transfer level as function design, by combining function blocks, such as registers and computing elements, composing the integrated circuit. Then the circuit is designed, as logical circuit design, at a gate level (logical level) composing a circuit at a register transfer level, by combining logical elements, such as gates, composing the function blocks such as computing elements with, for instance, a logical synthesis technology. Next the circuit is designed at a layout level as physical design, by combining elements, such as transistors, composing the logical elements such as gates.

Japanese Laid-Open Patent Application No. 5-126872/1993 (Tokukaihei 5-126872) discloses a power consumption predicting device which, as shown in FIG. 17, evaluates power consumption of the whole circuit and that of various parts of the circuit by calculating power consumption from the number of transitions (represented as a product of α and f in Eq. (1)) of each signal (node) when the circuit operates, from a load capacity (represented as C in Eq. (1)) charged and discharged by a single change of a signal, and from an operating voltage (represented as V in Eq. (1)), that are obtained from logical simulation, given information on switching, etc.

If it has turned out that the power consumption of the circuit does not meet the specification, the power consumption needs to be cut by, for example, improving a processing system of the circuit.

If a major change is needed in the circuit design after the design process has proceeded to the logical circuit design or the physical design, the redesign causes an increase in the total time period required for the development of the circuit. This is because no major change is possible in the logical circuit design, and the design process should be started all over again from the function design to reduce the power consumption by a large amount. Therefore, the design should be so carried out as to evaluate the power consumption at an earlier phase in the design process and to minimize the possibilities for redesign.

As mentioned above, when it has turned out that the power consumption of the circuit does not meet the specification, the power consumption needs to be cut by, for example, improving a processing system of the circuit. For this purpose, it is necessary to find out such places where power is consumed unnecessarily to the operation of the circuit and where power is consumed more than needed.

With the above conventional technology, it is possible to evaluate the power consumption of the circuit and to check if the power consumption meets the specification, However, it is impossible to present information on the places where power is consumed unnecessarily. Therefore, when the power consumption of the circuit does not meet the specification, the designer cannot know how to change the circuit design to cut the power consumption, which is an obstacle in reducing the power consumption.

SUMMARY OF THE INVENTION

A first object of the present invention is to offer a system for detecting power consumption of an integrated circuit that can present information on places in the integrated circuit where power is consumed unnecessarily, and that enables an effective measure to be taken to the integrated circuit to reduce the power consumption.

A second object of the present invention is to offer a storing medium for storing a computer program that can present information on places in the integrated circuit where power is consumed unnecessarily, and that enables an effective measure to be taken to the integrated circuit to reduce the power consumption.

A third object of the present invention is to offer a method for detecting power consumption of an integrated circuit that can present information on places in the integrated circuit where power is consumed unnecessarily, and that enables an effective measure to be taken to the integrated circuit to reduce the power consumption.

In order to accomplish the first object, the system for detecting power consumption of an integrated circuit in accordance with the present invention is characterized in that it includes unnecessary power consumption detecting means for detecting the number of times of a signal transition that is unnecessary to processing of the integrated circuit among all signal transitions of each element of the integrated circuit, and for obtaining, based on the number of times of the unnecessary signal transition, unnecessary power consumption that is power consumption caused by an unnecessary operation for each of the elements.

With the configuration, it is possible to present information on places where power is consumed unnecessarily, such as places in the integrated circuit where power is consumed unnecessarily and amounts of the unnecessary power consumption at places where power is consumed unnecessarily. Consequently, the designer of the integrated circuit can know how the circuit design should be changed to reduce the power consumption and can take an effective measure to the integrated circuit to reduce the power consumption thereof.

In order to accomplish the second object, the storing medium for storing a computer program for obtaining the power consumption of the integrated circuit in accordance with the present invention is characterized in that it detects the number of times of a signal transition that is unnecessary to processing of an integrated circuit among all signal transitions of each element of the integrated circuit, and obtains, based on the number of times of the unnecessary signal transition, unnecessary power consumption that is power consumption caused by an unnecessary operation for each of the elements.

The storing medium, incorporated in the system for detecting power consumption, enables the system for detecting power consumption to present information on places in the integrated circuit where power is consumed unnecessarily with the computer program. Consequently, the designer of the integrated circuit can know how the circuit design should be changed to reduce the power consumption and can take an effective measure to the integrated circuit to reduce the power consumption.

In order to accomplish the third object, the method for detecting power consumption of an integrated circuit in accordance with the present invention is characterized in that it includes a step of detecting the number of times of a signal transition that is unnecessary to processing of an integrated circuit among all signal transitions of each element of the integrated circuit, and a step of obtaining, based on the number of times of the unnecessary signal transition, power consumption caused by an unnecessary operation for each of the elements.

With the method, the designer of the integrated circuit can obtain information on places in the integrated circuit where power is consumed unnecessarily. Consequently, the designer of the integrated circuit can know how the circuit design should be changed to reduce the power consumption and can take an effective measure to the integrated circuit to reduce the power consumption.

For a fuller understanding of the nature and advantages of the invention, reference should be made to the ensuing detailed description taken in conjunction with the accompanying drawings.

DESCRIPTION OF THE EMBODIMENTS

FIRST EMBODIMENT

Referring to FIGS. 1 through 13, the following description will discuss an embodiment in accordance with the present invention.

Figure 2:
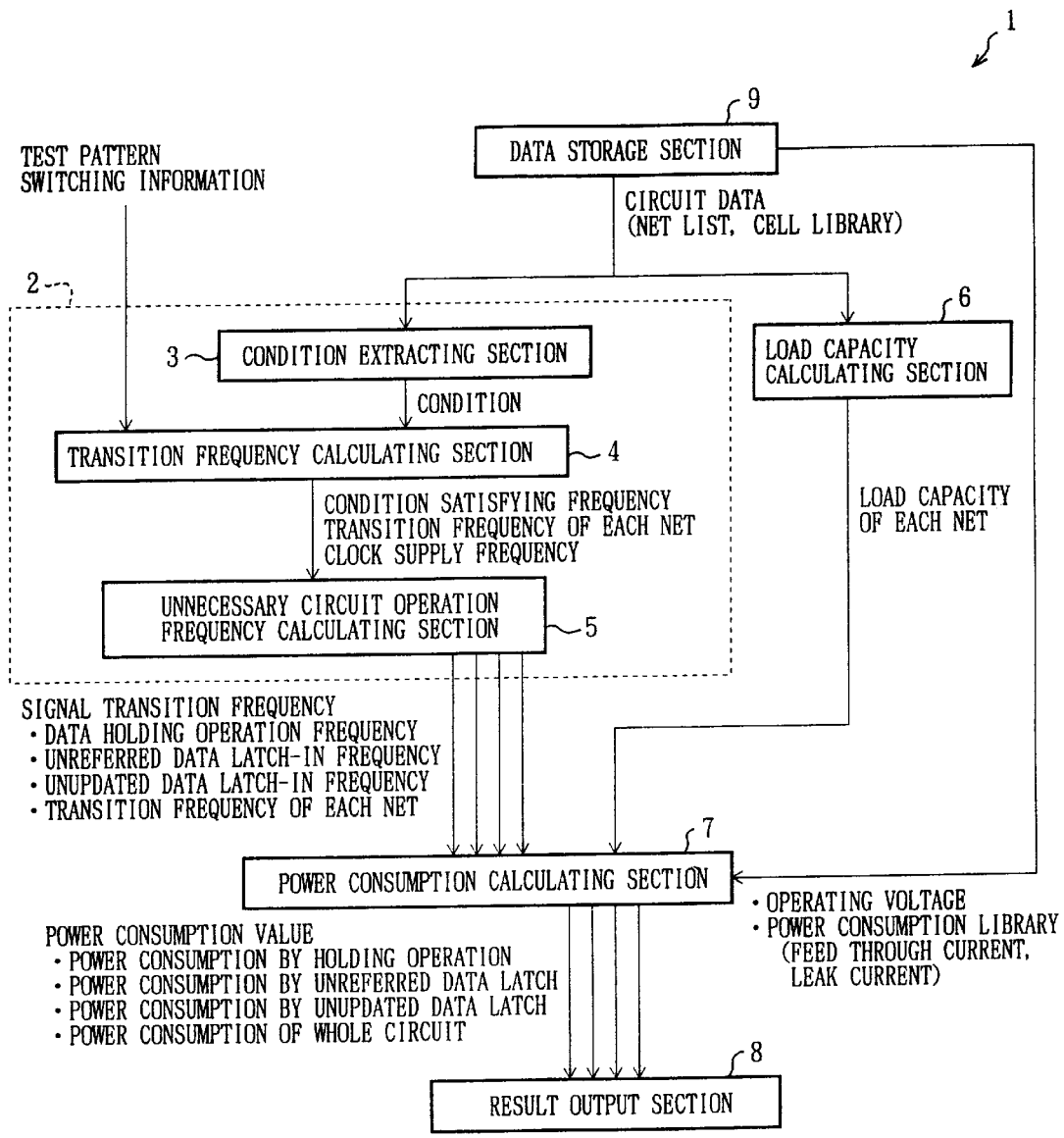
FIG. 2 is a block diagram schematically showing the entire configuration of the system shown in FIG. 1.

As shown in FIG. 2, the present system 1 as a system for detecting power consumption of an integrated circuit includes an unnecessary circuit operation distinguishing section (unnecessary circuit operation distinguishing means) 2, a load capacity calculating section (load capacity calculating means) 6, a power consumption calculating section (unnecessary power consumption calculating means) 7, and a result outputting section (result outputting means) 8. These sections 2, 6, 7 and 8 compose an unnecessary power consumption detecting section (unnecessary power consumption detecting means). The unnecessary circuit operation distinguishing section 2 has a condition extracting section (condition extracting means) 3, a transition frequency calculating section (transition frequency calculating means) 4, and an unnecessary circuit operation frequency calculating section (unnecessary circuit operation frequency calculating means) 5.

Figure 13:
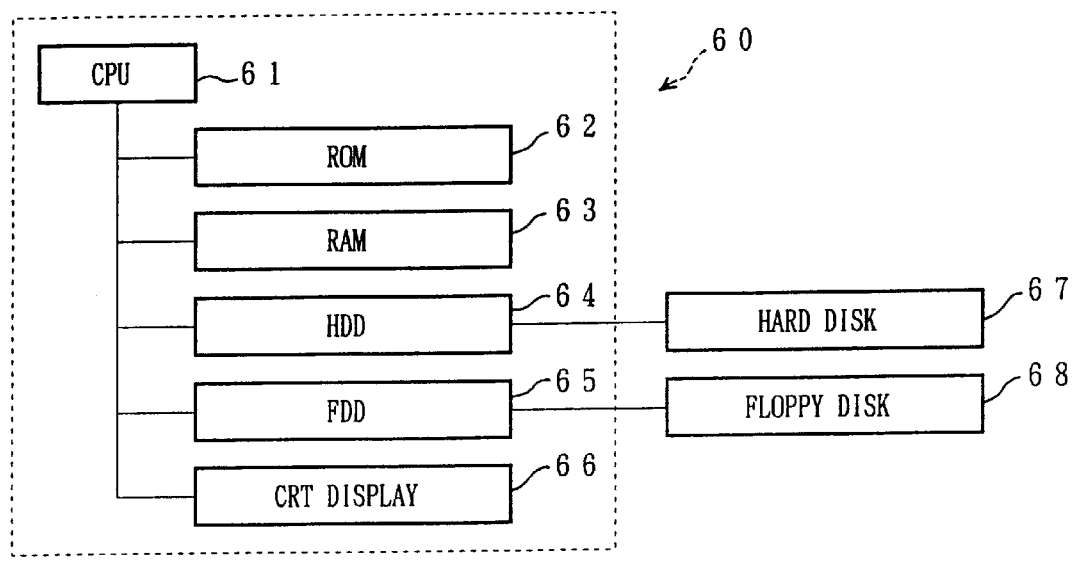
FIG. 13 is a block diagram showing a configuration of a computer embodying the present system.

For example, a computer 60 shown in FIG. 13 can be used as the present system 1. The computer 60 includes a central processing unit (CPU) 61, a read only memory (ROM) 62, a random access memory (RAM) 63, a hard disk drive (HDD) 64, a floppy disk drive (FDD) 65, and a cathode ray tube (CRT) display 66 as an output section. The CPU 61 is connected to a hard disk 67 as a data storage section 9 via the hard disk drive 64. The CPU 61 is connected to a floppy disk 68 via the floppy disk drive 65.

Any device capable of outputting the power consumption data (will be explained in detail later) as the result outputting section 8 can be used as the output section. For example, a display device such as a liquid crystal display (LCD) and a printing device such as a printer can be used in place of the CRT display 66 in the above configuration.

In the present system 1, the unnecessary circuit operation distinguishing section 2, the load capacity calculating section 6 and the power consumption calculating section 7 can be realized as a function module composed of the CPU 61 and a computer program. The computer program is stored either in the read only memory 62 as an internal memory device or in an external memory device (storing medium) such as the floppy disk 68 or the hard disk 67, and read into the random access memory 63 when the system is started.

The user, i.e., the designer of the electronic circuit, stores various kinds of data such as various kinds of circuit data and operating voltage data which will be described in detail later in the data storage section 9 in advance. The various kinds of circuit data are inputted from the data storage section 9 to the unnecessary circuit operation distinguishing section 2, the load capacity calculating section 6 and the power consumption calculating section 7.

Any memory device capable of storing the various kinds of data, as well as the hard disk 67, can be used as the data storage section 9: for example, the read only memory 62 or the floppy disk 68.

The load capacity calculating section 6 calculates the load capacity of each net as will be explained in detail later. The condition extracting section 3 extracts a register transfer condition, a next-stage register reference condition, and a previous-stage register updating condition. The transition frequency calculating section 4 calculates the number of times of a signal transition between elements per unit time.

Figure 1:
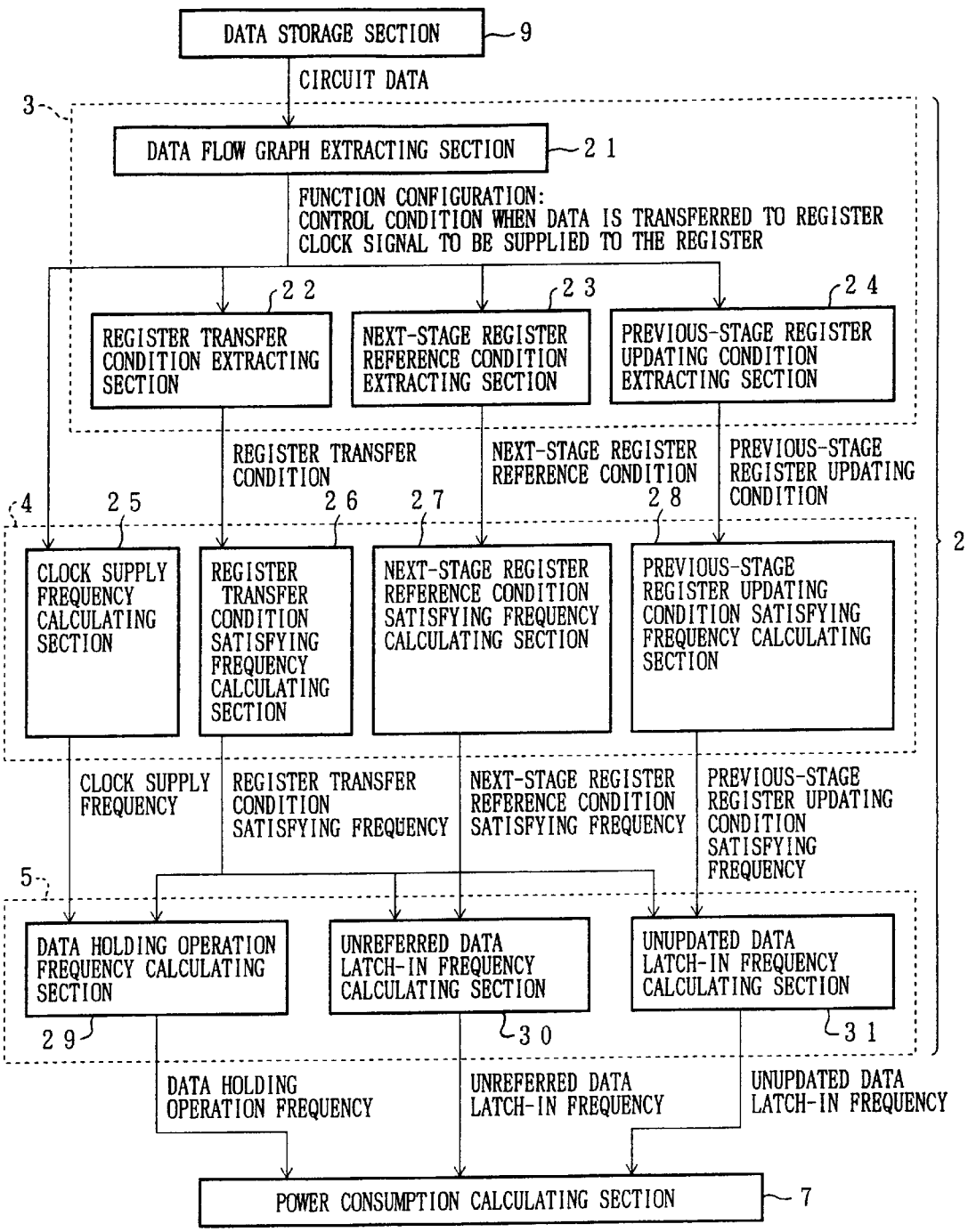
FIG. 1 is a block diagram showing a configuration of an unnecessary circuit operation distinguishing section in a configuration example of a system for detecting power consumption of an integrated circuit in accordance with the present invention.

FIG. 1 shows the unnecessary circuit operation distinguishing section 2 in detail.

The condition extracting section 3 has a data flow graph extracting section 21, a register transfer condition extracting section 22, a next-stage register reference condition extracting section 23, and a previous-stage register updating condition extracting section 24.

The transition frequency calculating section 4 has a clock supply frequency calculating section (time keeping means) 25, a register transfer condition satisfying frequency calculating section (register transfer condition satisfying frequency calculating means) 26, a next-stage register reference condition satisfying frequency calculating section (next-stage register reference condition satisfying frequency calculating means) 27, and a previous-stage register updating condition satisfying frequency calculating section (previous-stage register updating condition satisfying frequency calculating means) 28.

The unnecessary circuit operation frequency calculating section 5 has a data holding operation frequency calculating section (data holding operation frequency calculating means) 29, an unreferred data latch-in frequency calculating section (unreferred data latch-in frequency calculating means) 30, and an unupdated data latch-in frequency calculating section (unupdated data latch-in frequency calculating means) 31.

In the present system 1, (1) circuit connection information, (2) operation specifications of input and output signals of an integrated circuit including a test pattern and switching information, (3) a load capacity which is charged and discharged by a single change of the operating state of a terminal of a minimum unit component (basic element) composing circuits such as a computing element and a logical circuit, and (4) an operating voltage and a power consumption library of each basic element are inputted to respective sections.

That is, in the present system 1, the circuit data composed of the circuit connection information (net list) and the cell (basic element) library is inputted into the condition extracting section 3 and the load capacity calculating section 6, the operation specifications (a test pattern, switching information, etc.) are inputted into the transition frequency calculating section 4, and the operating voltage and the power consumption library are inputted into the power consumption calculating section 7.

The cell (basic element) library includes the load capacity which is charged by a single change of the operating state of a terminal of each basic element. The power consumption library is basic data (parameters) about each element for calculation of the power consumption, including a transient current and a leak current.

A circuit description at a function level, connection information at a logical level, and the like are used as the circuit connection information. Only circuit connection information at a gate level (logical level) or circuit connection information at a transistor level (layout level) can be used as the circuit connection information in the conventional technology; however, in the present embodiment, circuit connection information at a register transfer level can also be used. The present embodiment produces the best effects in reducing power consumption when the circuit connection information at a register transfer level is used.

The data flow graph extracting section 21 extracts information from the circuit data, or more specifically, extracts clock signals supplied to the registers, the connection states between the registers, and the control condition when data is referred to between the registers. Meanwhile, the load capacity calculating section 6 extracts from the circuit data a load capacity of each path (net) between the registers along which data is transferred, and sends the extracted load capacities to the power consumption calculating section 7.

The conventional means for calculating the state transition frequency is replaced in the present system 1 by the register transfer condition extracting section 22, the next-stage register reference condition extracting section 23 and the previous-stage register updating condition extracting section 24 that extract the register transfer condition (RTC), the next-stage register reference condition (RC), and the previous-stage register updating condition (UC), respectively, from the control condition, extracted by the data flow graph extracting section 21, when data is referred to between the registers as shown in FIG. 1 and in the dotted-line box in FIG. 2.

The register transfer condition (RTC) is a condition that is true if the register under discussion stores inside thereof, for example, data of a register in the previous stage and a result of processing dependent on that data.

The next-stage register reference condition (RC) is a condition that is true if a register in the next stage of the register under discussion stores inside thereof, for example, data of the register under discussion and a result of processing dependent on that data.

The previous-stage register updating condition (UC) is a condition that is true if a register in the previous stage of the register under discussion updates data.

The register transfer condition extracting section 22, the next-stage register reference condition extracting section 23 and the previous-stage register updating condition extracting section 24 send the register transfer condition RTC, the next-stage register reference condition RC, and the previous-stage register updating condition UC to the register transfer condition satisfying frequency calculating section 26, the next-stage register reference condition satisfying frequency calculating section 27 and the previous-stage register updating condition satisfying frequency calculating section 28, respectively.

The clock supply frequency calculating section 25, the register transfer condition satisfying frequency calculating section 26, the next-stage register reference condition satisfying frequency calculating section 27 and the previous-stage register updating condition satisfying frequency calculate section 28 calculates a clock supply frequency (CA), a register transfer condition satisfying frequency (RTA), a next-stage register reference condition satisfying frequency (RA), and a previous-stage register updating condition satisfying frequency (UA).

That is, the clock supply frequency calculating section 25 calculates the clock supply frequency (CA) from the clock signals supplied to the registers, and calculates the elapsed time. The clock supply frequency (CA) represents the number of times that the clock is supplied to the respective registers per unit time.

The register transfer condition satisfying frequency calculating section 26 calculates the register transfer condition satisfying frequency RTA from the register transfer condition. The register transfer condition satisfying frequency RTA represents the number of times that the register transfer condition (RTC) is satisfied per unit time.

The next-stage register reference condition satisfying frequency calculating section 27 calculates the next-stage register reference condition satisfying frequency RA from the next-stage register reference condition. The next-stage register reference condition satisfying frequency RA represents the number of times that the next-stage register reference condition RC is satisfied per unit time.

The previous-stage register updating condition satisfying frequency calculating section 28 calculates the previous-stage register updating condition satisfying frequency UA from the previous-stage register updating condition UC. The previous-stage register updating condition satisfying frequency UA represents the number of times that the previous-stage register updating condition UC is satisfied per unit time.

As described as above, the transition frequency calculating section 4 can distinguish unnecessary signal transitions from necessary signal transitions, and calculate the number of times of an unnecessary signal transition per unit time, with the clock supply frequency calculating section 25, the register transfer condition satisfying frequency calculating section 26, the next-stage register reference condition satisfying frequency calculating section 27 and the previous-stage register updating condition satisfying frequency calculating section 28.

The clock supply frequency calculating section 25, the next-stage register reference condition satisfying frequency calculating section 27 and the previous-stage register updating condition satisfying frequency calculating section 28 send, respectively, the clock supply frequency, the next-stage register reference condition satisfying frequency, and the previous-stage register updating condition satisfying frequency to the data holding operation frequency calculating section 29, the unreferred data latch-in frequency calculating section 30 and the unupdated data latch-in frequency calculating section 31. The register transfer condition satisfying frequency calculating section 26 sends the register transfer condition satisfying frequency to the data holding operation frequency calculating section 29, the unreferred data latch-in frequency calculating section 30 and the unupdated data latch-in frequency calculating section 31.

Although not shown in FIG. 1, the transition frequency calculating section 4 calculates the total number of times of a transition of each net per unit time, and sends the total number of times of a transition of each net per unit time to the power consumption calculating section 7 via the unnecessary circuit operation frequency calculating section 5 as shown in FIG. 2.

The unnecessary circuit operation frequency calculating section 5 of the present system 1 calculates a data holding operation frequency that represents the number of times of an operation to hold the value of the register per unit time, an unreferred data latch-in frequency that represents the number of times of a storing of unreferred data per unit time, and an unupdated data latch-in frequency that represents the number of times of a storing of unupdated data per unit time.

That is, the data holding operation frequency calculating section 29 calculates the data holding operation frequency from the clock supply frequency and the register transfer condition satisfying frequency, and sends the data holding operation frequency to the power consumption calculating section 7.

The unreferred data latch-in frequency calculating section 30 calculates the unreferred data latch-in frequency from the register transfer condition satisfying frequency and the next-stage register reference condition satisfying frequency, and sends the unreferred data latch-in frequency to the power consumption calculating section 7.

The unupdated data latch-in frequency calculating section 31 calculates the unupdated data latch-in frequency from the register transfer condition satisfying frequency and the previous-stage register updating condition satisfying frequency, and sends the unupdated data latch-in frequency to the power consumption calculating section 7.

The power consumption calculating section 7 calculates unnecessary and reducible power consumption: i.e., (1) data holding operation power consumption (HP) that represents power consumption caused by an operation to hold data, (2) unreferred data storing operation (unreferred data latch-in) power consumption (NRP) that represents power consumption caused by an operation of a register to store inside thereof unreferred data, and (3) unupdated data storing operation (unupdated data latch-in) power consumption (NUP) that represents power consumption by an operation of a register to store inside thereof unupdated data.

In other words, the power consumption calculating section 7 calculates the data holding operation power consumption (HP) for each of the registers from the data holding operation frequency, the load capacity connected to that register, and the operating voltage. The power consumption calculating section 7 also calculates the unreferred data storing operation power consumption (NRP) for each of the registers from the unreferred data latch-in frequency, the load capacity connected to that register, and the operating voltage. The power consumption calculating section 7 also calculates the unupdated data storing operation power consumption (NUP) for each of the registers from the unupdated data latch-in frequency, the load capacity connected to that register, and the operating voltage.

In addition, the power consumption calculating section 7 calculates the power consumption of the whole circuit from the state transition frequency of each of the signals in the circuit (transition frequency of each net), the load capacity connected to each of the registers, and the operating voltage.

The present system 1 is provided with the unnecessary circuit operation distinguishing section 2 which, as explained above, distinguishes circuit operations that are unnecessary for the integrated circuit to carry out its processing from those that are necessary. The present system thereby calculates the number of times that an operation to hold data of a register, an operation to store unreferred data inside, and an operation to store unupdated data inside, that are all unnecessary circuit operations, are performed per unit time, and detects power consumption caused by those unnecessary operations and places (the names of registers) where the unnecessary power consumption occurs.

As shown in FIG. 2, the present system 1 shows places where the power consumption calculating section 7 has detected that reducible power is consumed and values of that power consumption, as well as the power consumption of the whole circuit, to the designer of the circuit at the result outputting section 8. The designer can efficiently design a less-power-consuming circuit by conducting the design based on these results.

Besides, since a measure can be taken at an earlier phase in the design process to reduce the power consumption, a combination of such a measure and a power-consumption-reducing technology that is adoptable at a later phase in the design process produces an effect of more greatly reducing the power consumption.

With the conventional technologies, it is difficult to change the circuit design to reduce the power consumption, because the circuit data to be used for that purpose is very specific data such as the gate level (logical level) or the transistor level (layout level). By contrast, with the above-explained configuration, since the power consumption of a circuit can be calculated at a register transfer level, a change can be efficiently made to the circuit design.

Next, the following description will explain the operations to detect the power consumption.

Figure 6:
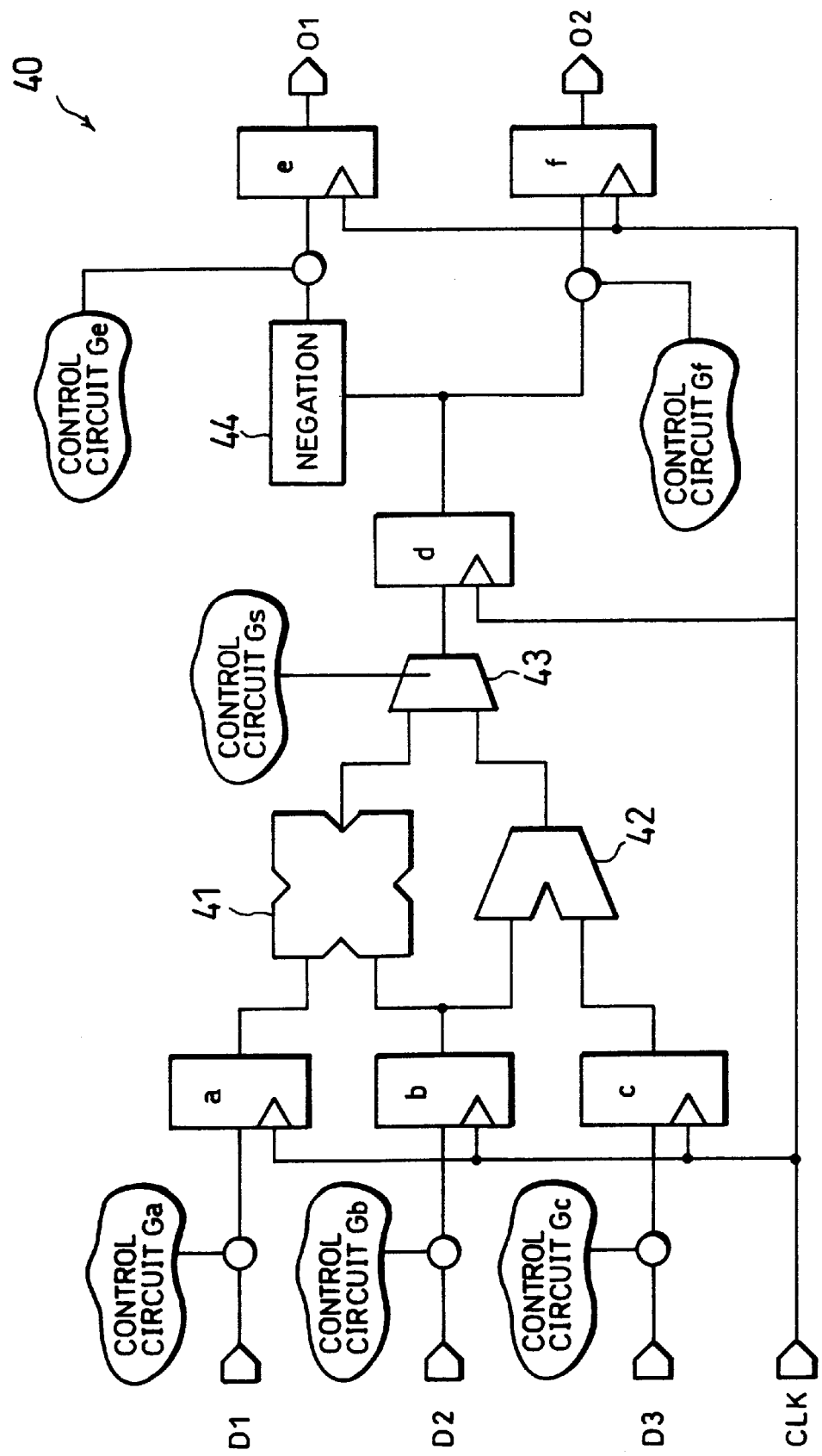
FIG. 6 is a circuit diagram showing an example of a circuit at a register transfer level.

The following will explain a case of detecting the power consumption of the integrated circuit 40 shown in FIG. 6. The integrated circuit 40 includes registers a, b and c into which respective sets of data D1, D2 and D3 are inputted, a register d disposed in the next stage of the registers a, b and c, and registers e and f, disposed in the next stage of the register d, for outputting respective output signals O1 and O2.

The registers a and d are connected with each other via a multiplier 41 and a selector 43. The registers b and d are connected with each other via the selector 43 and either the multiplier 41 or an adder 42. The registers c and d are connected with each other via the adder 42 and the selector 43. A negation circuit 44 is provided between the registers d and e.

The integrated circuit 40 includes control circuits Ga, Gb and Gc for controlling a data input to the respective registers a, k and c, a control circuit Gs for controlling the selector 43, and control circuits Ge and Gf for controlling a data input to the respective registers e and f.

Clock signals CKNa, CKNb, CKNc, CKNd, CKNe and CKNf are supplied to the registers a, b, c, d, e and f respectively. Here, the same clock signal CLK is used as all these clock signals.

Figure 7:
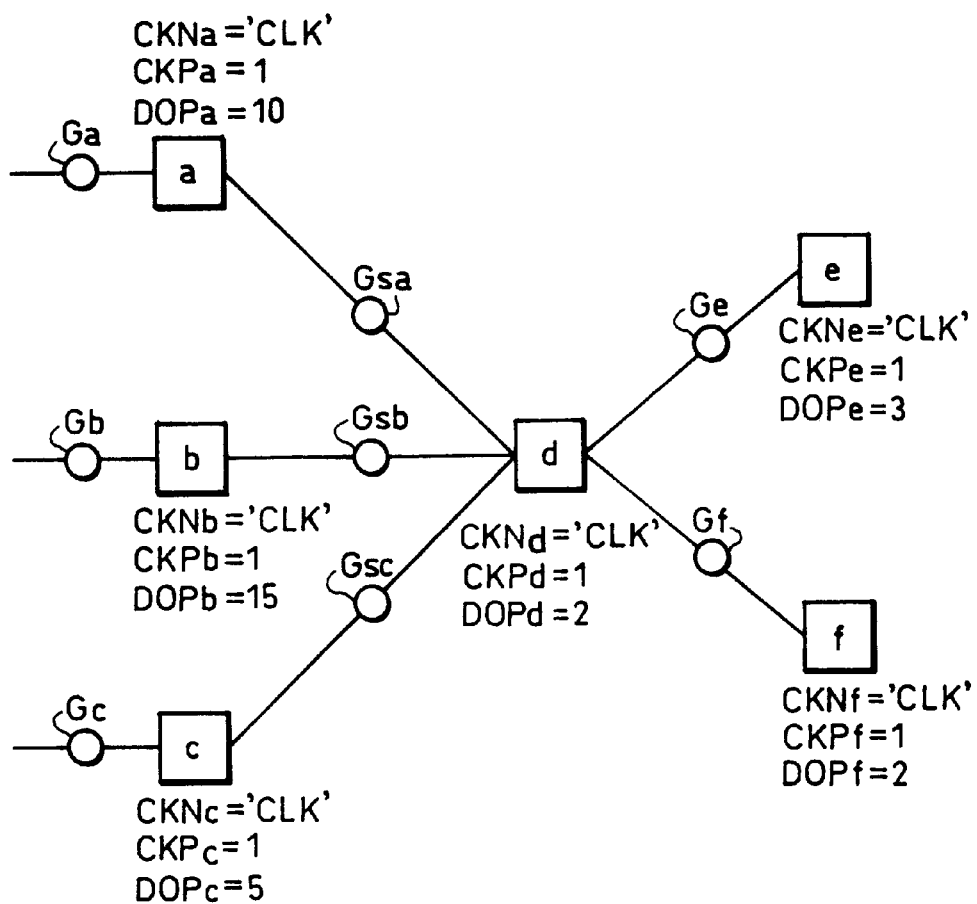
FIG. 7 is an explanatory drawing showing an example of a data flow graph corresponding to FIG. 6.

In FIG. 7 and in FIG. 8 which will be described later, conditions for transferring data to the registers a through f are denoted by the same symbols as the control circuits for controlling these registers. However, since the control circuit Gs controls a condition for transferring data from the register a to the register d, a condition for transferring data from the register b to the register d, and a condition for transferring data from the register c to the register d, these transfer conditions are respectively denoted as Gsa, Gsb and Gsc.

In the following explanation, power consumption by a single supply of a clock to one of the registers a through f is respectively denoted as CKPa, CKPb, CKPc, CKPd, CKPe and CKPf. Power consumption by a single change of a data output of one of the registers x is respectively denoted as DOPa, DOPb, DOPc, DOPd, DOPe and DOPf. The operating voltage is denoted as V and set here to a value of 3.

1. Extraction of Conditions

The following conditions are first extracted for all the registers. That is, connection information of the registers and control conditions when data is referred to between the registers are extracted with the data flow graph extracting section 21 in accordance with the circuit diagram (circuit data) at a register transfer level shown in FIG. 6, so as to be expressed as data flow graphs such as the ones shown in FIGS. 7 through 11. Then the following operations ① through ③ are carried out.

① Extraction of Register Transfer Conditions (RTCs)

The register transfer condition is a condition that is true if the register under discussion stores inside thereof, for example, data from a register in the previous stage and a result of processing dependent on data of a register in the previous stage.

This is extracted by extracting with the register transfer condition extracting section 22 from a data flow graph a plurality of data transfer paths from registers in the previous stage and then by calculating a logical sum of the control conditions for transferring data along the data transfer paths. If the condition is true, the register under discussion stores inside thereof, for example, data of a register in the previous stage and a result of processing dependent on that data. It is supposed for convenience that data transfer to a register that has no register in the previous stage always occurs.

Figure 8:
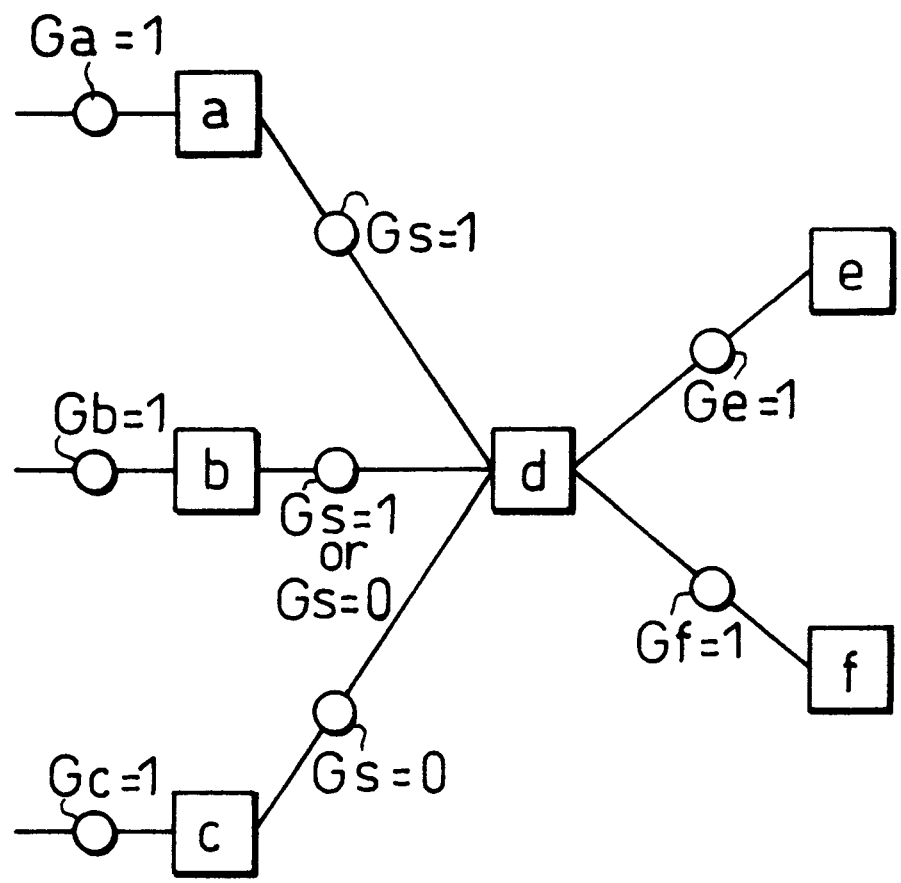
FIG. 8 is an explanatory drawing showing an example of a data flow graph.
Figure 9:
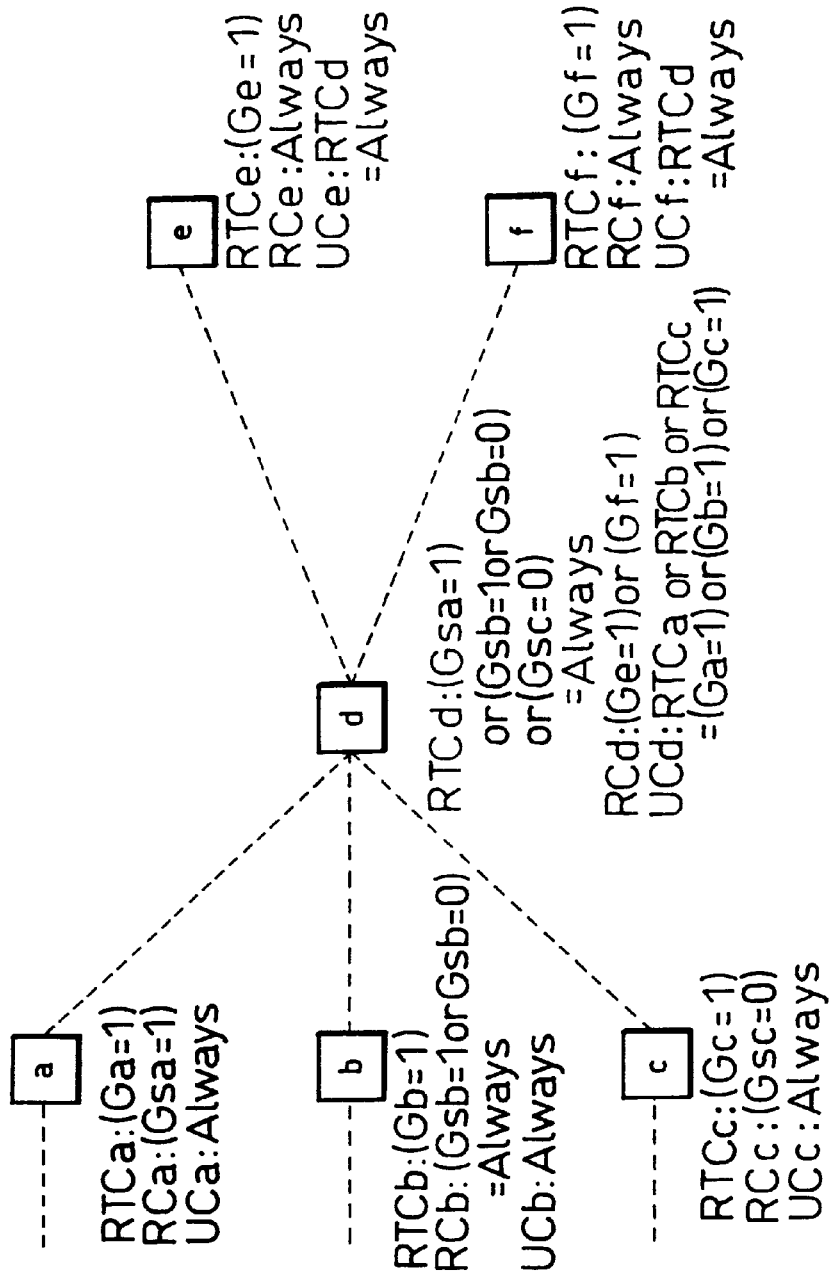
FIG. 9 is an explanatory drawing showing an example of extraction of a register transfer condition, a next-stage register reference condition, and a previous-stage register updating condition.

As shown in FIGS. 8 and 9, the register d will be discussed. RTC of the register d will be denoted as RTCd. In the same manner, RTCs of the registers a, b, c, e and f are denoted as RTCa, RTCb, RTCc, RTCe and RTCf respectively.

Data is transferred to the register d in three cases: namely, (1) when Gsa=1, that is, data from the register a is sent via a multiplier and stored in the register d, (2) when Gsb=1, or Gsb=0, that is, data from the register b is sent via a multiplier or an adder and stored in the register d, (3) when Gsc=0, that is, data from the register c is sent via an adder and stored in the register d.

Therefore, the register transfer condition of the register d RTCd is true if one of the following three conditions is true:

$$RTCd=(Gsa=1) \text{ or } (Gsb=1 \text{ or } Gsb=0) \text{ or } (Gsc=0) \qquad (2)$$

Consequently, RTCd is always true. "Always" in FIG. 9 represents that the condition is always true.

In the same manner, RTCa, RTCb, RTCC, RTCe and RTCf are obtained:
RTCa=(Ga=1)
RTCb=(Gb=1)
RTCc=(Gc=1)
RTCe=(Ge=1)
RTCf=(Gf=1)

② Extraction of Next-stage Register Reference Condition (RC)

The next-stage register reference condition is a condition that is true if a register in the next stage of the register under discussion stores inside thereof, for example, a data output of the register under discussion and a result of processing dependent on a data output of the register under discussion.

This is extracted by extracting with the next-stage register reference condition extracting section 23 from a data flow graph a data transfer path to a register in the next stage and then by calculating a logical sum of control conditions for transferring data along the data transfer path. If the condition is true, one of the registers in the next stage stores inside thereof, for example, a data output of the register in discussion and a result of processing dependent on the data output. It is supposed for convenience that data of a register that has no register in the next stage is always referred to.

In the same manner, the register d will be discussed. RC of the register d will be denoted as RCd. In the same manner, RCs of the registers a, b, c, e and f are denoted as RCa, RCb, RCc, RCe and RCf respectively.

Data of the register d is referred to in two cases: namely, (1) when Gd=1, that is, the register e stores data of the register d via a negation circuit, (2) when Gf=1, that is, the register f stores the data of the register d.

Therefore, the next-stage register reference condition of the register d RCd is true if one of the following two conditions is true:

$$RCd=(Ge=1) \text{ or } (Gf=1) \tag{3}$$

In the same manner, RCa, RCb, RCc, RCe and RCf are obtained:
RCa=(Gsa=1)
RCb=(Gsb=1 or Gsb=0)=Always
RCc=(Gsc=1)
RCe=Always
RCf=Always ③ Extraction of Previous-stage Register Updating Condition (UC)

The previous-stage register updating condition is a condition that is true if a register in the previous stage of the register under discussion updates data.

This is extracted by extracting with the previous-stage register updating condition extracting section 24 from a data flow graph a plurality of data transfer paths to a register in the previous stage, by calculating the register transfer condition of each of the registers in the previous stage and then by calculating a logical sum of the register transfer conditions (RTCs). If the condition is true, data is updated in one of the registers in the previous stage. It is supposed for convenience that data in a register that has no register in the previous stage is always updated.

In the same manner, the register d will be discussed. UC of the register d will be denoted as UCd. In the same manner, UCs of the registers a, b, c, e and f are denoted as UCa, UCb, UCc, UCe and UCf respectively.

Input data to the register d is updated in three cases: namely, (1) when Ga=1, that is, data of the register a is updated, (2) when Gb=1, that is, data of the register b is updated, (3) when Gc=1, that is, data of the register c is updated. Therefore, the previous-stage register updating condition of the register d UCd is true if one of the following three conditions is true:

$$UCd=(Ga=1) \text{ or } (Gb=1) \text{ or } (Gc=1) \tag{4}$$

In the same manner, UCa, UCb, UCc, UCe and UCf are obtained and are always all true (Always).

The three conditions are extracted as above. Note that the three conditions can be extracted in any sequence.

2. Calculation of Frequency of CA, RTA, RA and UA

Figure 10:
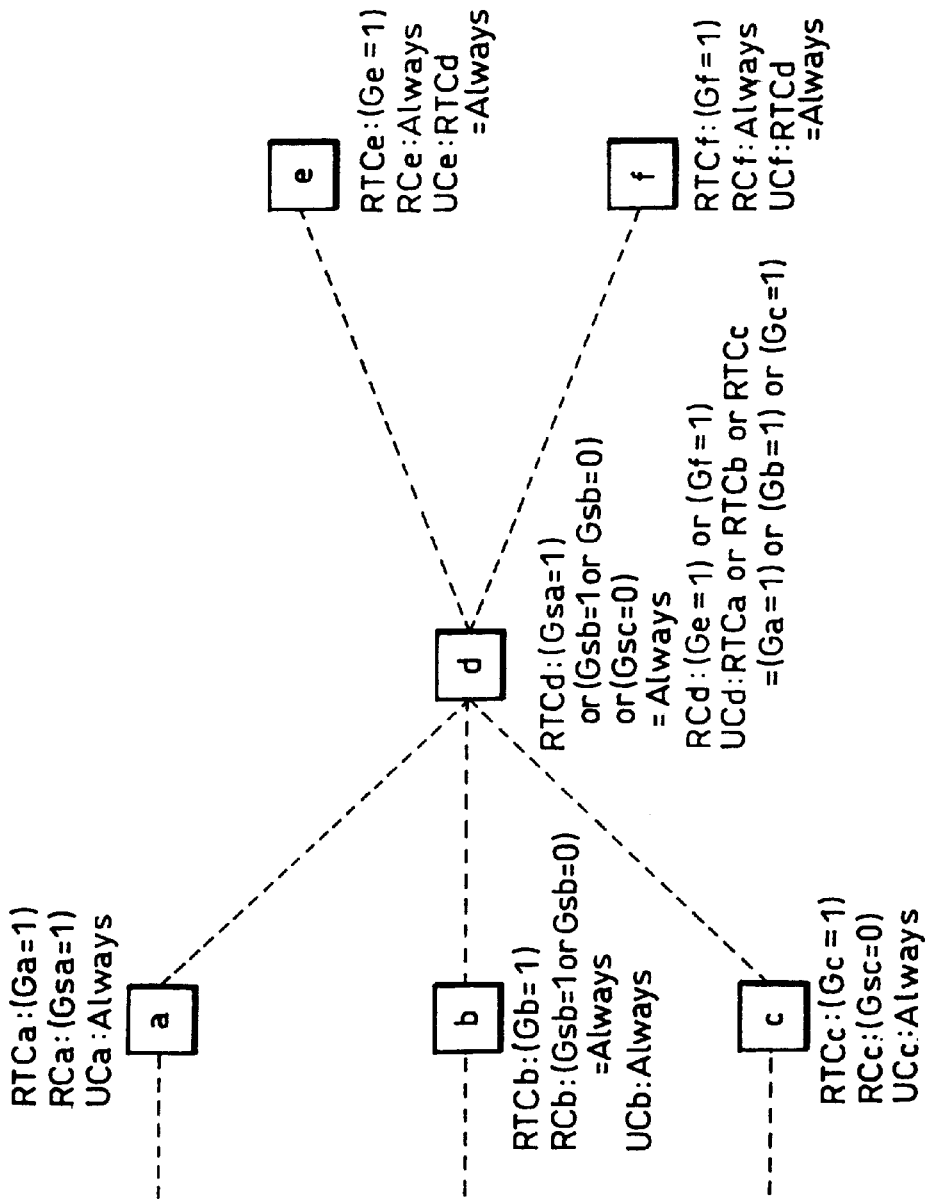
FIG. 10 is an explanatory drawing showing an example of extraction of a register transfer condition, a next-stage register reference condition, and a previous-stage register updating condition.
Figure 11:
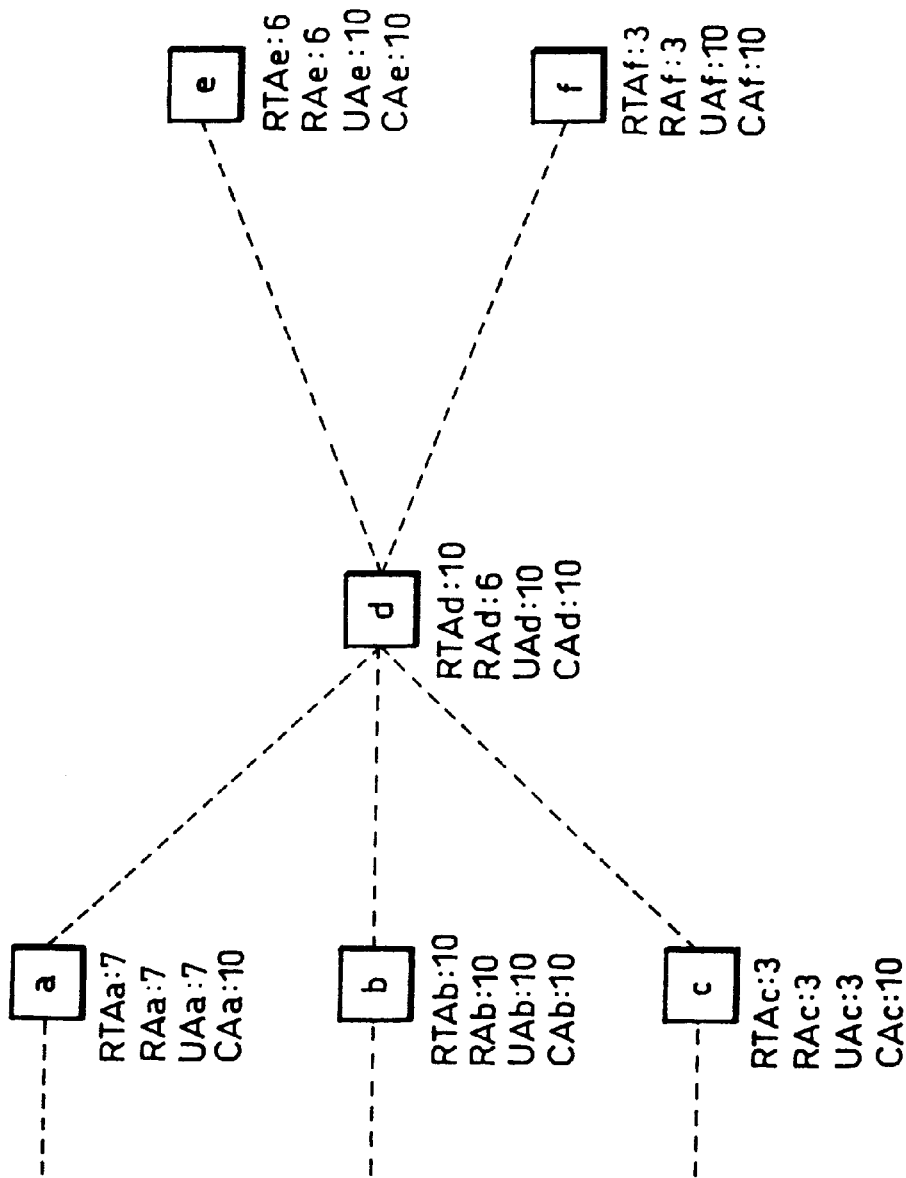
FIG. 11 is an explanatory drawing showing an example of a result of calculation for the number of times that the condition is satisfied.

Next, the number of times that each following condition is satisfied per unit time is calculated for the registers with the following frequency calculating sections as shown in FIGS. 10 and 11. For example, an active method by simulation and a static method by a propagation of switching information can be used for this purpose.

That is, the number of times that a clock signal is supplied to the registers per unit time CA is calculated by the clock supply frequency calculating section 25. The number of times that the register transfer condition RTC is satisfied per unit time RTA is calculated by the register transfer condition satisfying frequency calculating section 26.

The number of times that the next-stage register reference condition RC is satisfied per unit time RA is calculated by the next-stage register reference condition satisfying frequency calculating section 27. The number of times that the previous-stage register updating condition UC is satisfied per unit time UA is calculated by the previous-stage register updating condition satisfying frequency calculating section 28.

CAs for the registers a through f are denoted as CAa, CAb, CAc, CAd, CAe and CAf. Denotations of the same way are applied to RTA, RA and UA.

However, if the register transfer condition RTC is always satisfied (true), it is supposed for convenience that the register transfer condition satisfying frequency RTA has the same value as the number of times that a clock signal is supplied to the registers per unit time CA. If the next-stage register reference condition RC and the previous-stage register updating condition UC are always satisfied (true), it is supposed for convenience that the respective condition satisfying frequencies RA and UA thereof have the same value as the register transfer condition satisfying frequency RTA.

In the present embodiment, it is assumed that the frequencies shown in FIG. 11 are obtained for the registers shown in FIG. 10.

3. Calculation for HP, NUP and NRP for All Registers

Next, the following power consumptions ①, ② and ③ are calculated for each of the registers.

① Power Consumption by Operation of Register to Hold data (HP)

The power consumption by an operation of a register to hold data (HP) is calculated with the data holding operation frequency calculating section 29 and the power consumption calculating section 7 shown in FIG. 1, from the number of times that the register transfer occurs per unit time (the number of times that the register transfer condition is true RTA), the number of times that the clock is supplied per unit time CA, a load capacity which is charged and discharged by a single supply of the clock to the register under discussion CKC, and the operating voltage V, using the equation:

$$HP=(CA-RTA)\times CKC\times V^2 \tag{5}$$

If HP>0, it is possible to reduce the power consumption HP, and if HP=0, there is no reducible power consumption HP.

HPa through HPf of the registers in the present embodiment are calculated as follows:

$$HPa=(CAa-RTAa)\times CKCa\times V^2=(10-7)\times 1\times 3 2=27 \tag{6}$$

$$HPb=(CAb-RTAb)\times CKCb\times V^2=(10-10)\times 1\times 3 2=0 \tag{7}$$

$$HPc=(CAc-RTAc)\times CKCc\times V^2=(10-3)\times 1\times 3 2=63 \tag{8}$$

$$HPd=(CAd-RTAd)\times CKCd\times V^2=(10-10)\times 1\times 3 2=0 \tag{9}$$

$$HPe=(CAe-RTAe)\times CKCe\times V^2=(10-6)\times 1\times 3 2=36 \tag{10}$$

$$HPf=(CAf-RTAf)\times CKCf\times V^2=(10-3)\times 1\times 3=63 \tag{11}$$

In FIG. 7, as mentioned above, for example, the value of CKCa×V² is denoted as CKPa, that is the power consumption by a single supply of a clock to the register a, and the value is described together. Denotations and descriptions of the same way are applied to the registers b, c, d, e and f.

② Power Consumption by Storing Unreferred Data Inside (NRP)

The power consumption by storing unreferred data inside (NRP) is calculated with the unreferred data latch-in frequency calculating section 30 and the power consumption calculating section 7 shown in FIG. 1, from the number of times that the register transfer to the register under discussion occurs per unit time (the number of times that the register transfer condition is true RTA), the number of times that the data output of the register under discussion is referred to by a register in the next stage (the number of times that the next-stage register reference condition is true RA), a load capacity which is charged and discharged by a single change of a data output of the register under discussion DOC, and the operating voltage V, using the equation:

$$NRP=(RTA-RA) \times DOC \times V^2 \qquad (12)$$

If NRP>0, it is possible to reduce the power consumption NRP, and if NRP=0, there is no reducible power consumption NRP.

NRPa through NRPf of the registers in the present embodiment are calculated as follows:

$$NRPa=(RTAa-RAa) \times DOCa \times V^2=(7-7) \times 10 \times 32=0 \qquad (13)$$

$$NRPb=(RTAb-RAb) \times DOCb \times V^2=(10-10) \times 15 \times 32=0 \qquad (14)$$

$$NRPc=(RTAc-RAc) \times DOCc \times V^2=(3-3) \times 5 \times 32=0 \qquad (15)$$

$$NRPd=(RTAd-RAd) \times DOCd \times V^2=(10-6) \times 2 \times 32=72 \qquad (16)$$

$$NRPe=(RTAe-RAe) \times DOCe \times V^2=(6-6) \times 3 \times 32=0 \qquad (17)$$

$$NRPf=(RTAf-RAf) \times DOCf \times V^2=(3-3) \times 2 \times 32=0 \qquad (18)$$

In FIG. 7, as mentioned above, for example, the value of DOCa×V² is denoted as DOPa, that is the power consumption by a single change of a data output of the register a, and the value is described together. Denotations and descriptions of the same way are applied to the registers b, c, d, e and f.

③ Power Consumption by Storing Unupdated Data Inside (NUP)

The power consumption by storing unupdated data inside (NUP) is calculated with the unupdated data latch-in frequency calculating section 31 and the power consumption calculating section 7 shown in FIG. 1, from the number of times that the register transfer to the register under discussion occurs per unit time (the number of times that the register transfer condition is true RTA), the number of times that a register in the previous stage of the register under discussion changes data (the number of times that the previous-stage register updating condition is true UA), a load capacity which is charged and discharged by a single change of the data output of the register under discussion DOC, and the operating voltage V, using the equation:

$$NUP=(RTA-UA) \times DOC \times V^2 \qquad (19)$$

If NUP>0, it is possible to reduce the power consumption NUP, and if NUP=0, there is no reducible power consumption NUP.

NUPa through NUPf of the registers in the present embodiment are calculated as follows:

$$NUPa=(RTAa-UAa) \times DOCa \times V^2=(7-7) \times 10 \times 32=0 \qquad (20)$$

$$NUPb=(RTAb-UAb) \times DOCb \times V^2=(10-10) \times 15 \times 32=0 \qquad (21)$$

$$NUPc=(RTAc-UAc) \times DOCc \times V^2=(3-3) \times 5 \times 3=0 \qquad (22)$$

$$NUPd=(RTAd-UAd) \times DOCd \times V^2=(10-10) \times 2 \times 32=0 \qquad (23)$$

$$NUPe=(RTAe-UAe) \times DOCe \times V^2=(6-10) \times 3 \times 32=-108 \qquad (24)$$

$$NUPf=(RTAf-UAf) \times DOCf \times V^2=(3-10) \times 2 \times 32=-126 \qquad (25)$$

4. Calculation for Power Consumption of Whole Circuit

The power consumption of the whole circuit P is calculated with the power consumption calculating section 7 shown in FIGS. 1 and 2, from the number of times of a state transition of each signal in the circuit (the number of times of a transition of each net) N, the load capacity that is a minimum unit component connected to each signal C, and the operating voltage V, using the equation:

$$P=\Sigma(N \times C) \times V^2 \qquad (26)$$

In the present embodiment, it is assumed that P=1000 is obtained as a result of calculation.

5. Output of Results

The result outputting section 8 shown in FIG. 2 outputs the name and calculated reducible power consumption HP, NUP and NRP for all the registers.

In the present embodiment, the following power consumption out of the power consumption of the whole circuit P=1000 are outputted as reducible power consumption: namely, (a) a power consumption when the register d stores inside thereof unreferred data: NRPD=72,
(b) a power consumption when the register c carries out an operation to hold data: HPc=63,
(c) a power consumption when the register f carries out an operation to hold data: HPf=63,
(d) a power consumption when the register e carries out an operation to hold data: HPe=36, and
(e) a power consumption when the register a carries out an operation to hold data: HPa=27.

Figure 12:
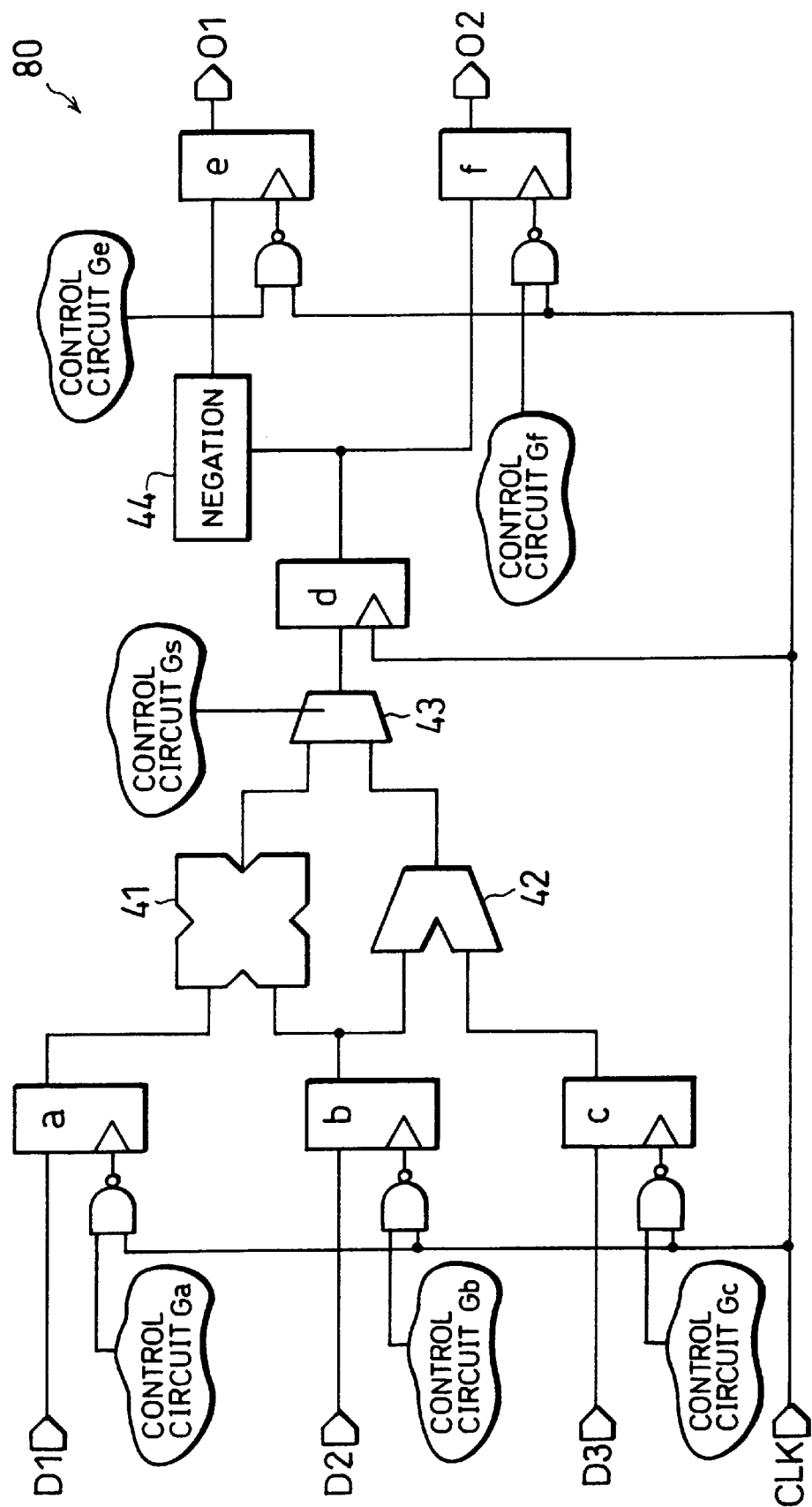
FIG. 12 is a circuit diagram showing an example of a less-power-consuming circuit at a register transfer level.

The integrated circuit 40 at a register transfer level shown in FIG. 6 is redesigned so as to be less power-consuming in accordance with the above results. The integrated circuit 80 in FIG. 12 is such a redesign example. More specifically, the control circuits Ga, Gb, Gc, Ge and Gf of the integrated circuit 40 are replaced with control circuits Ga', Gb', Gc', Ge' and Gf' for controlling inputs of clock signals to the registers a, b, c, e and f.

The clock is then made a gated clock with respect to the registers a, b, c, e and f by using the control circuits Ga', Gb', Gc', Ge' and Gf', and configured to be supplied to the registers a, b, c, e and f only when needed. This eliminates a signal transition that occurs when unnecessary data is propagated, and can therefore reduce the power consumption.

As described so far, the system 1 has an unnecessary power consumption detecting section for calculating power consumption of an integrated circuit from the number of times of a signal transition of elements thereof, a load capacity, and an operating voltage of each signal, for identifying, among those signal transitions, signal transitions that are necessary and unnecessary for the integrated circuit to carry out its processing, for detecting the number of times of a signal transition that is unnecessary to carry out the processing, and for calculating, using the number of times of an unnecessary signal transition, unnecessary power consumption that is power consumption caused by unnecessary operations.

The above configuration gives information as to how the circuit should be changed to reduce the power consumption of the circuit in the following manner. Signal transitions happen between elements of the integrated circuit. The power consumption increases with an increase in the number of times of the signal transition, the load capacity which is charged and discharged by a single change of each of the signals, and the operating voltage.

For example, as mentioned above, the number of times of a signal transition of a logical circuit composed of CMOS and the like is expressed as a product of an operation ratio $\alpha$ and an operation frequency f. The power consumption of this logical circuit increases with an increase in the number of times of a signal transition of the signals (nodes) upon operation of the circuit, that is obtained from logical simulation, given information on switching, etc., a load capacity C which is charged and discharged by a single change of each of the signals, and the operating voltage V.

However, the number of times of a signal transition contains the number of times of a signal transition for the integrated circuit to perform operations which are not definitely necessary to carry out its processing. So the configuration of the present invention distinguishes between the signal transitions that are necessary to carry out the processing and those that are not necessary, and thus detects and identifies with the unnecessary power consumption detecting section power consumption caused by the unnecessary signal transitions and places where it happens.

This makes it possible to present information on the places where power is consumed unnecessarily in the circuit, which could not be known with the conventional technologies. Also this enables the designer to know where improvements should be made to reduce the power consumption of the circuit. Therefore, the designer can know, when the specifications are not met, how to change the circuit to reduce the power consumption and take an efficient measure to reduce the power consumption.

The present invention can also be applied to a circuit at a register transfer level and to a more specific circuit at a gate level (a logical circuit).

Besides, it is made possible to efficiently design a less power consuming circuit, by the inclusion of the result outputting section for presenting the designer the detected places where the reducible power consumption occurs and the detected amounts of the reducible power consumption.

As mentioned above, in the system 1, the unnecessary power consumption detecting section detects power consumed by the operation to hold data as unnecessary power consumption out of the power consumed by the operations of the register, by calculating, from the control condition when the data is transferred to the register, the number of times that condition 1 that is true if the register under discussion stores inside thereof the result of processing dependent on the data of a register in the previous stage is satisfied, and then by calculating, from that number of times, the number of times of an operation of the register under discussion to hold data of its own, which are unnecessary operations to carry out the processing.

Figure 3:
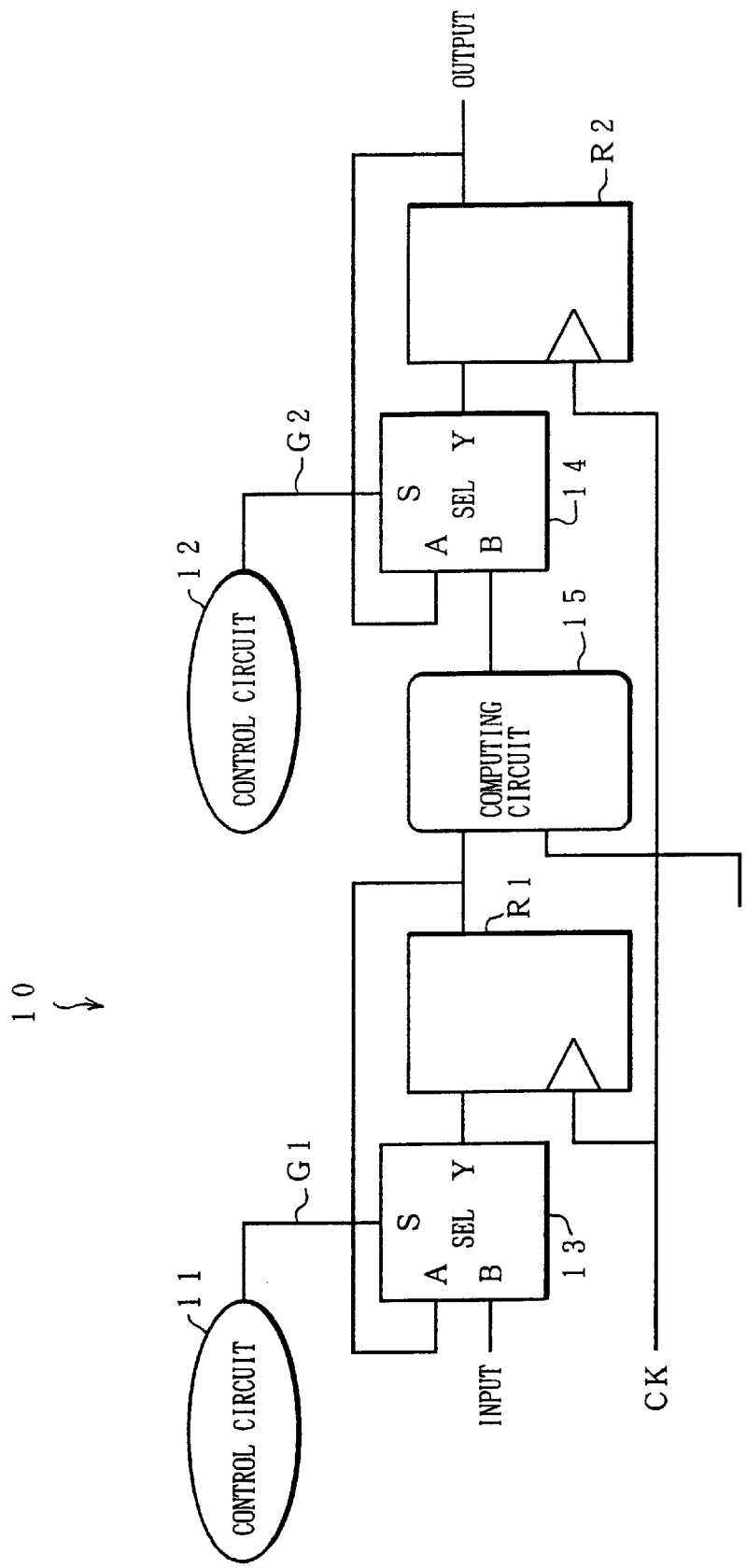
FIG. 3 is a circuit diagram showing a configuration example of a register driven by a clock.

The places where the power consumption can be reduced and the amounts of the reducible power consumption are calculated with the above configuration in the following manner. Here, registers of an edge-trigger method will be explained as an example. As shown in FIG. 3, a register circuit 10 of an edge-trigger method as an integrated circuit includes control circuits 11 and 12, registers R1 and R2, selectors (SELs) 13 and 14, and a computing circuit 15. The selectors 13 and 14 output an input signal from a terminal A out of a terminal Y when the control signal inputted from a terminal S is 1, and output an input signal from a terminal B out of the terminal Y when the control signal inputted from the terminal S is 0.

As to the register circuit 10, a data input signal (INPUT) is inputted from the terminal B of the selector 13 and a result of calculation (OUTPUT) is outputted from the register R2. Besides, a control signal (guard) G1 is transmitted from the control circuit 11 to the terminal S of the selector 13, a control signal (guard) G2 is transmitted from the control circuit 12 to the terminal S of the selector 14, and a clock signal CK is transmitted from a clock (not shown) to the registers R1 and R2.

The registers R1 and R2 store a data input signal inside thereof with a leading or trailing edge of the clock signal CK, and simultaneously output that data. As to a data input to the registers R1 and R2, either a data output of those registers or data propagated from a register in the previous stage is selected by the control signals G1 and G2.

In the present configuration, "the data holding operation" is dealt with as an operation that is unnecessary for the integrated circuit to carry out its processing.

Figure 4:
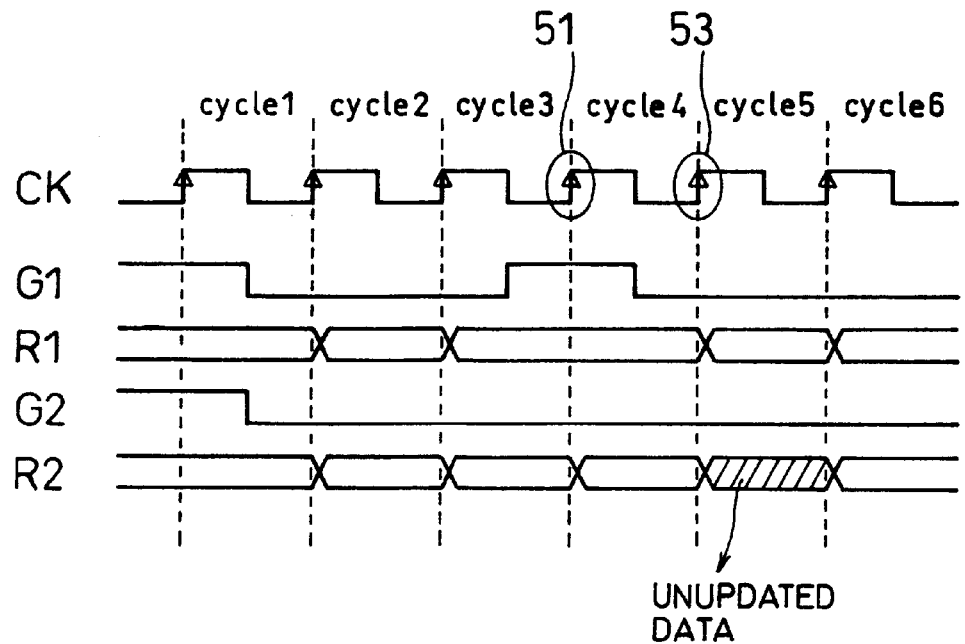
FIG. 4 is an explanatory drawing showing an example of a timing waveform for a clock, a data input and a data output supplied to the register shown in FIG. 3.

Reference is made to FIG. 4. The register R1 latches in data from the previous stage (data input signal) when the control signal G1 is 0, and latches in an output of its own when the control signal G1 is 1. The register R2 latches in data from the register R1 in the previous stage when the control signal G2 is 0, and latches in an output of its own when the control signal G2 is 1.

A data holding operation 51 shown in FIG. 4 is an operation of the register R1 in discussion to hold the last data output of its own by self-feedback, and power consumption of a clock is caused by this operation. Since the same data is stored, the data output does not change, and the power consumption caused by this holding operation is reducible.

The power consumption can be reduced by a large amount, while restraining the increase in the time period required for the redesign, by calculating the places where the power consumption can be reduced and the amounts of the reducible power consumption in this manner. Besides, since a measure can be taken at an earlier phase in the design process to reduce the power consumption, a combination of such a measure and a power-consumption-reducing technology that is adoptable at a later phase in the design process produces an effect of more greatly reducing the power consumption. In addition, since the power consumption can be known at a register transfer level, a change can be efficiently made in the circuit design.

Moreover, conventional power consumption predicting (analyzing and estimating) systems cannot point out the places where the power consumption can be reduced, and only be used when the logical circuit design, the physical design, etc. have completed. Therefore, if the power consumption is to be reduced by a large amount to satisfy the target specifications, it is inevitable to start the design process all over again from the function design, and to greatly increase the time period required for the design process. However, the power consumption predicting system configured as above in accordance with the present invention can be used in a function design process such as the register transfer level, and thereby can restrain an increase in the time period required for the redesign to greatly reduce the power consumption.

Furthermore, since a measure can be taken at an earlier phase in the design process to reduce the power consumption, a combination of such a measure and a power-consumption-reducing technology that is adoptable at a later phase in the design process produces an effect of more greatly reducing the power consumption.

In addition, with the conventional technologies, it is difficult to change the circuit design to reduce the power consumption, because the circuit data used for that purpose is very specific data, such as the gate level (logical level) or the transistor level (layout level). By contrast, with the above configuration in accordance with the present invention, since the power consumption can be known at a register transfer level, a change can be efficiently made to the circuit design.

Furthermore, as mentioned above, in the system 1, the unnecessary power consumption detecting section detects power consumed by storing unreferred data inside in the next stage as the unnecessary power consumption out of the power consumed by the operations of the register, by calculating, from the control condition when the data is transferred to the register, the number of times that condition 1 that is true if the register under discussion stores inside thereof the result of processing dependent on the data of a register in the previous stage is satisfied, by calculating the number of times that condition 2 that is true if a register in the next stage stores inside thereof the result of processing dependent on the data of the register under discussion is satisfied, and then by calculating, from that number of times, the number of times that the register under discussion stores inside thereof data unreferred to by a register in the next stage.

The places where the power consumption can be reduced and the amounts of the reducible power consumption are calculated with the above configuration in the following manner. The example shown in FIG. 3 will be explained here in the same manner as above. In the present configuration, "the unreferred data storing operation" is dealt with as an example of the operations that are unnecessary for the integrated circuit to carry out its processing.

Figure 5:
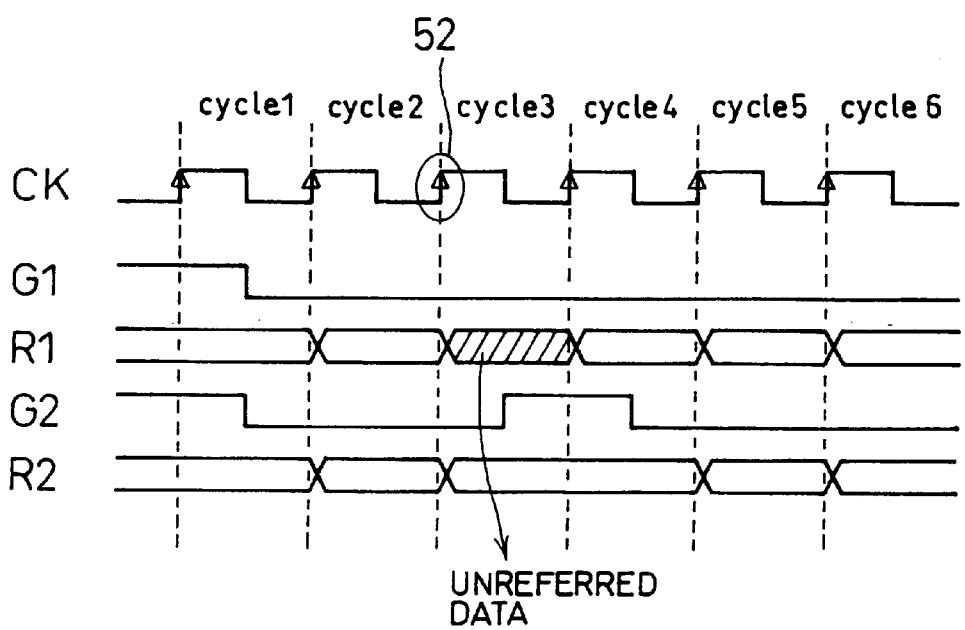
FIG. 5 is an explanatory drawing showing an example of a timing waveform for a clock, a data input and a data output supplied to the register shown in FIG. 3.

As shown in FIG. 5, power is consumed by operations of the computing circuit 15, etc. caused by the transmission of the clock signal CK to the register R1, the data output of the register R1 and the like, caused by an unreferred data latch-in 52 for the register R1 to store data inside thereof although the register in the next stage R2 has not referred to the data output of the register R1. When the output of the register R1 is propagated to the register in the next stage R2, and the register in the next stage R2 does not store inside thereof the data of the register in its previous stage, i.e., of the register under discussion R1, the result of processing dependent on that data and the like, even if the register under discussion R1 stores data inside thereof, the data output of the register R1 does not affect the results. Therefore, the power consumption caused by this operation is reducible.

The power consumption can be reduced by a large amount, while restraining the increase in the time period required for the redesign, by calculating the places where the power consumption can be reduced and the amounts of the reducible power consumption in this manner. Besides, since a measure can be taken at an earlier phase in the design process to reduce the power consumption, a combination of such a measure and a powerconsumption-reducing technology that is adoptable at a later phase in the design process produces an effect of more greatly reducing the power consumption. In addition, since the power consumption can be known at a register transfer level, a change can be efficiently made in the circuit design.

Besides, as mentioned above, in the system 1, the unnecessary power consumption detecting section detects power consumed by storing unupdated data inside in the previous stage as the unnecessary power consumption out of the power consumed by the operations of the register, by calculating, from the control condition when the data is transferred to the register, the number of times that condition 1 that is true if the register under discussion stores inside thereof the result of processing dependent on the data of a register in the previous stage is satisfied, by calculating the number of times that condition 3 that is true if the register in the previous stage stores inside thereof the result of processing dependent on data of a register in the previous stage of that stage is satisfied, that is, by calculating the number of times that data of a register in the previous stage of the register under discussion is updated, and then by calculating, from those numbers, the number of times that the register under discussion stores inside thereof the result of processing dependent on data unupdated by a register in the previous stage.

The places where the power consumption can be reduced and the amounts of the reducible power consumption are calculated with the above configuration in the following manner. The example shown in FIG. 3 will be explained here in the same manner as above. In the present configuration, "the unupdated data storing operation" is dealt with as an example of the operations that are unnecessary for the integrated circuit to carry out its processing.

Reference is again made to FIG. 4. The register R2 latches in data from the register R1 in the previous stage when the control signal G2 is 0, and latches in an output of its own when the control signal G2 is 1.

As shown in FIG. 4, power is consumed by operations of a computing element, etc. caused by the transmission of the clock signal CK to the register R2, the data output of the register R2 and the like, caused by an unupdated data latch-in 53 for the register R2 to store data inside thereof although the register in the previous stage R1 has not updated the data. When data from the register in the previous stage R1 is selected with the control signal G2 as a data input of the register under discussion R2, even if the data not updated by the register in the previous stage R1, the result of processing independent on that data, and the like are newly stored inside, the data output of the register R2 neither changes nor affects the results. Therefore, the power consumption caused by this operation is reducible.

The power consumption can be reduced by a large amount, while restraining the increase in the time period required for the redesign, by calculating the places where the power consumption can be reduced and the amounts of the reducible power consumption in this manner. Besides, since a measure can be taken at an earlier phase in the design process to reduce the power consumption, a combination of such a measure and a power-consumption-reducing technology that is adoptable at a later phase in the design process produces an effect of more greatly reducing the power consumption. In addition, since the power consumption can be known at a register transfer level, a change can be efficiently made in the circuit design.

SECOND EMBODIMENT

Figure 14:
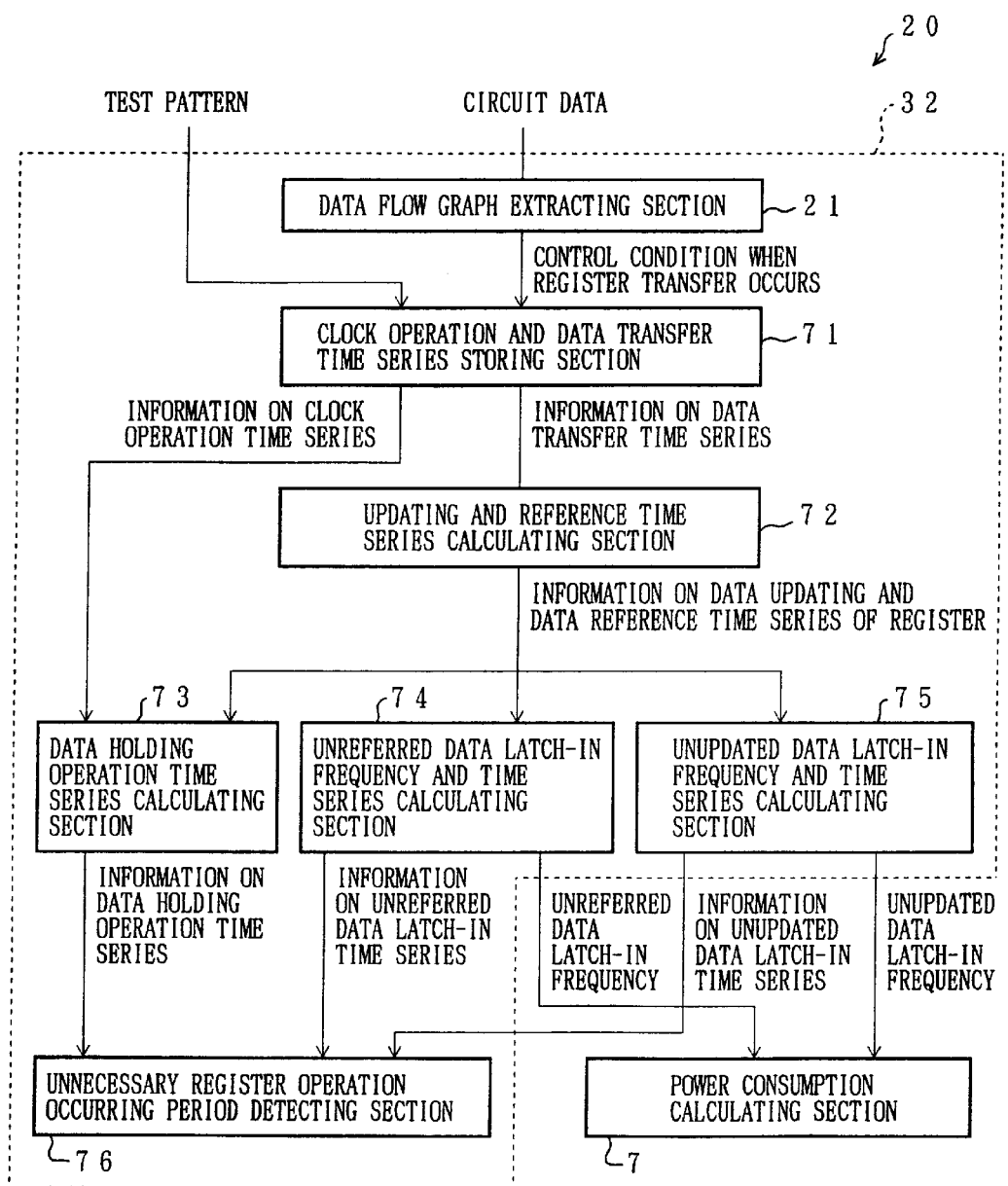
FIG. 14 is a block diagram showing a configuration of a main portion of another configuration example of a system for detecting power consumption of an integrated circuit in accordance with the present invention.
Figure 15:
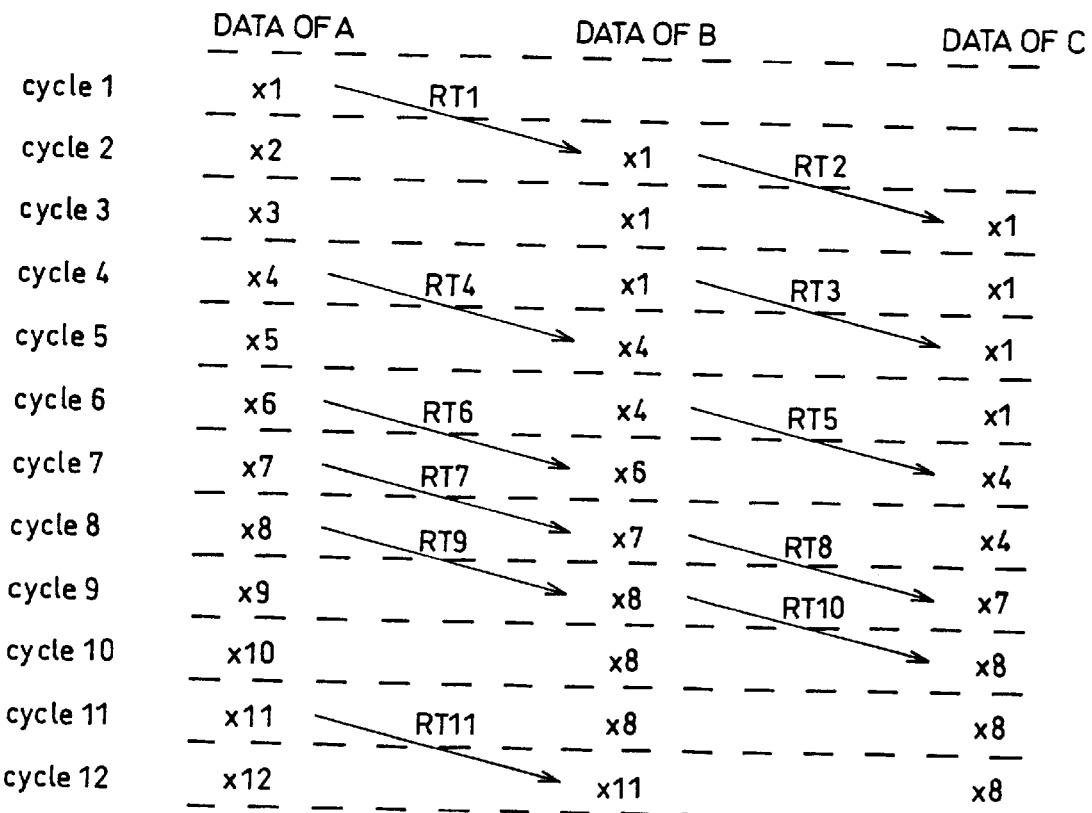
FIG. 15 is an explanatory drawing showing how data is transferred between registers.
Figure 16:
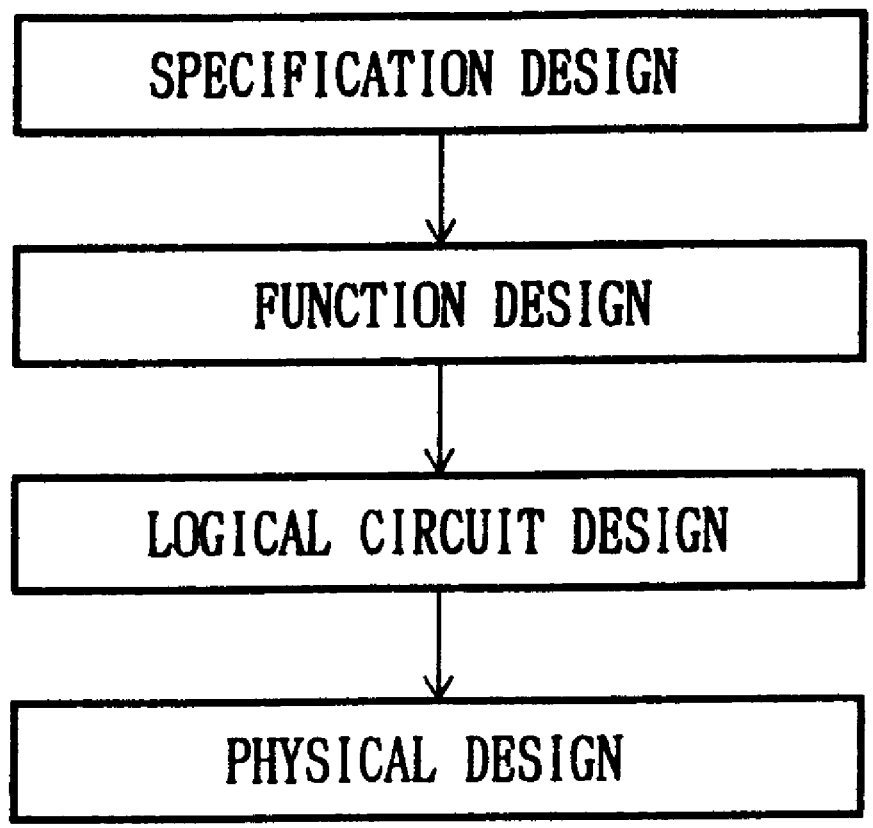
FIG. 16 is an explanatory drawing showing a typical design flow of an integrated circuit.
Figure 17:
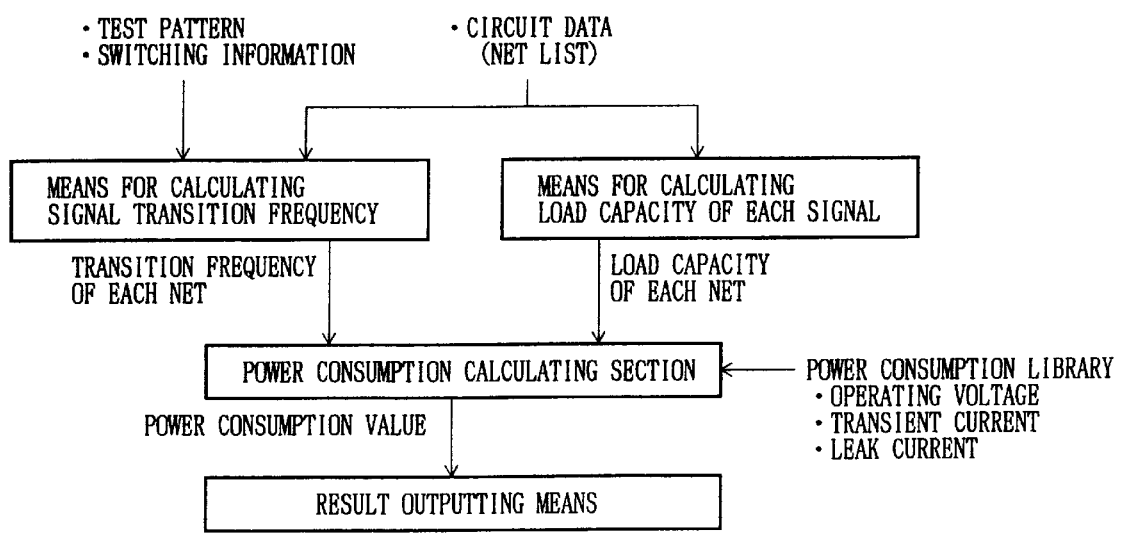
FIG. 17 is a block diagram showing a configuration example of a conventional power consumption predicting device.

Referring to FIGS. 2, 14 and 15, the following description will discuss another embodiment in accordance with the present invention. Here, for convenience, members of the second embodiment that have the same function as members of the first embodiment, and that are mentioned in the first embodiment are indicated by the same reference numerals and description thereof is omitted.

As shown in FIG. 2, the system 20 as a system for detecting power consumption of an integrated circuit of the present embodiment, includes, as the first embodiment, a load capacity calculating section 6, a power consumption calculating section 7, and a result outputting section 8. The unnecessary circuit operation distinguishing section 2 shown in FIG. 2 is replaced with an unnecessary circuit operation distinguishing section (unnecessary circuit operation distinguishing means) 32 shown in FIG. 14. These sections 6, 7, 8 and 32 compose an unnecessary power consumption detecting section (unnecessary power consumption detecting means). The load capacity calculating section 6 and the power consumption calculating section 7, the result outputting section 8, and the unnecessary circuit operation distinguishing section 32 can be realized as a function module composed of a CPU and a computer program as in the first embodiment.

As shown in FIG. 14, the unnecessary circuit operation distinguishing section 32 has a data flow graph extracting section 21, a clock operation and data transfer time series storing section (signal propagation time series storing means) 71 for storing a time series that a clock operation occurs and a time series that a data transfer occurs, an updating and reference time series calculating section (sequence relation detecting means) 72 for calculating a time series of data updatings and data references of a register, a data holding operation time series calculating section (data holding detecting section) 73, an unreferred data latch-in frequency and time series calculating section (unnecessary propagation detecting section) 74, an unupdated data latch-in frequency and time series calculating section (unnecessary propagation detecting section) 75, and an unnecessary register operation occurring period detecting section (unnecessary operation period detecting means) 76.

Next, a process of an unnecessary circuit operation distinguishing operation will be roughly explained.

1. First, the data flow graph extracting section 21 extracts a control condition for registers to refer to data therebetween as a register transfer condition.
2. Next, the clock operation and data transfer time series storing section 71 stores all the times when the register transfer condition is satisfied, which are obtained by carrying out simulation.
3. Then, the following frequencies and time series are calculated or set for all the registers:
    (a) The data holding operation time series calculating section 73 obtains, so as to drive the register under discussion, a time series of operations of that register to hold data from a time series of the operations to supply a clock to the register, and from a time series of operations of the register to refer to data of a register in the previous stage and update data inside thereof;
    (b) The unreferred data latch-in frequency and time series calculating section 74 calculates the number of times that the register under discussion refers to a register in the previous stage, stores data inside thereof, then, before the data is referred to in the next stage, refers to a next set of data in the previous stage and stores the data inside thereof. The unreferred data latch-in frequency and time series calculating section 74 then sets the calculated number as an unreferred data latch-in frequency (NRA) of the register under discussion. Besides, the unreferred data latch-in frequency and time series calculating section 74 calculates a time series that the unreferred data latch-in operation occurs; and (c) The unupdated data latch-in frequency and time series calculating section 75 calculates the number of times that the register under discussion refers to data again after the register under discussion refers to a register in the previous stage and stores data inside thereof and before the data in the register in the previous stage is updated. The unupdated data latch-in frequency and time series calculating section 75 then sets the calculated number as an unupdated data latch-in operation frequency (NUA) of the register under discussion. Besides, the unupdated data latch-in frequency and time series calculating section 75 calculates a time series that the unupdated data latch-in operation occurs.

The unnecessary data latch-in operation frequencies (NRA and NUA) are calculated with these operations.

4. Next, a power consumption due to storing of unreferred data inside a register NRP is calculated, in the same manner as Eq. (12) of the first embodiment, with Eq. (27):

$$NRP = NRA \times DOC \times V^2 \qquad (27)$$

5. A power consumption due to storing of unupdated data inside a register NUP is calculated, in the same manner as Eq. (19) of the first embodiment, with Eq. (28):

$$NUP = NUA \times DOC \times V^2 \qquad (28)$$

6. Thereafter, the unnecessary register operation occurring period detecting section 76 calculates, for all the registers, a time period when an unnecessary register transfer operation occurs consecutively.

This is done, for all the registers, by merging the time series that the data holding operation occurs (clock cycle), calculated by the data holding operation time series calculating section 73, the time series that the unreferred data latch-in operation occurs, calculated by the unreferred data latch-in frequency and time series calculating section 74, and the time series that the unupdated data latch-in operation occurs, calculated by the unupdated data latch-in frequency and time series calculating section 75, and then obtaining the time series that one of the unnecessary register operations occurs.

The first time of the time series of the unnecessary register operations is stored as the starting time of an unnecessary register operation occurring period. Subsequently, the time series is scanned from old to new, and if the unnecessary register operation occurs consecutively, the times are stored (updated) as the finishing time of the unnecessary register operation occurring period, and the consecutively occurring frequency is increased by one. When the unnecessary register operation does not occur consecutively, the starting and finishing times of the unnecessary register operation occurring period so far stored are stored as an unnecessary register operation occurring period, and the starting time is updated.

Next, the following description will explain a specific example of calculation of the unreferred data latch-in frequency and that of the unupdated data latch-in frequency.

It is assumed that there are a register a, a control circuit Gb, a register b, a control circuit Gb, and a register c as shown in FIG. 15. A control condition when data is transferred from the register a to the register b is denoted by the circuit name as Gb, while a control condition when data is transferred from the register b to the register c is denoted by the circuit name as Gc. A clock is supplied to the registers a, b and c at every clock cycle. The register a refers to data of a register in the previous stage and stores the data inside thereof at every clock cycle. Consecutive clock cycles are denoted as cycle 1, cycle 2 . . . and cycle 12, while transferred sets of data are denoted as x1, x2 . . . and x12. The arrows RT1 through RT11 in FIG. 15 indicate that data is transferred between the registers.

(Calculation of Unreferred Data Latch-In Frequency)

The register b will be discussed. The register b refers to the data x1 of the register a and stores the data inside thereof in cycle 2 (arrow RT1). Since the data x1 is referred to by the register c in cycle3 (RT2), the storing of the data x1 by the register b is not waste.

However, the next data x7 is stored by the register b in cycle 8 (RT7) before the register c in the next stage refers to the data x6 stored by the register b in cycle7 (RT6). Therefore, the operation of the register b to store the data x6 (RT6) is a wasteful operation (unreferred data latch-in operation).

The register b stores six sets of data x1, x4, x6, x7, x8 and x11 in cycles 1 through 12, and the register c refers to four sets of them: x1, x4, x7 and x8. Therefore, the register b stores two unreferred sets of data and the unreferred data latch-in frequency NRAb is two.

Meanwhile, in this example of data transfer, if the data transfer is analyzed with a method explained in the first embodiment, since the number of times that the register b refers to data of the register a in the previous stage RTAb is six, and the number of times that the register b is referred to by the register c in the next stage RAb is five, the unreferred data latch-in frequency of the register b NRAb is expressed as:

$$NRAB=RTAB-RAb=6-5=1 \tag{29}$$

Therefore, the number of times of an unreferred data latch-in is one.

The following is an example of detection of an unreferred data latch-in operation. A reference flag is set for each register. The reference flag of the register is set when data stored inside the register is referred to, that is, when a register in the next stage refers to the data and stores the data inside thereof. The reference flag of each register is reset when the data of the register is updated, that is, data of a register in the previous stage is referred to and stored inside.

Here, when the register under discussion stores data, if the reference flag is not set, the data stored in the previous cycle has not been referred to by a register in the next stage. Therefore, in this case, the number of times of the unreferred data latch-in of the register under discussion is increased by one. By contrast, when the register under discussion stores data, if the reference flag has been already set, the data stored in the previous cycle has been effectively used, that is, referred to by a register in the next stage. Therefore, in this case, the number of times of the unreferred data latch-in of the register under discussion is not changed.

Calculation of Unupdated Data Latch-In Frequency

The register c will be discussed. In cycle 3 (arrow RT2), the register c refers to the data x1 of the register b and stores the data x1 inside thereof. The register c also refers to the data of the register b in cycle 5 (RT 3). But this data is the same data as the data x1 referred to in cycle 3 (RT2) and is not necessarily stored again. Therefore, an operation to store this data in the register c in cycle 5 (RT3) is a wasteful operation (unupdated data latch-in operation).

The register c stores the data of the register b five times (RT2, RT3, RT5, RT8 and RT10), but only stores four kinds of data, x1, x4, x7 and x8 in cycles 1 through 12. Therefore, the register c stores a set of unupdated data, and the unupdated data latch-in frequency NUA is one.

Meanwhile, in this example of data transfer, if the data transfer is analyzed with a method explained in the first embodiment, since the number of times that the register c refers to data of the register b in the previous stage RTAC is five, and the number of times that the register b refers to the data of the register a in the previous stage UAc is six, the unupdated data latch-in frequency of the register c NUAc is expressed as:

$$NUAc=RTAC-UAc=5-6=-1 \tag{30}$$

Since the result is negative, the number of times of an unupdated data latch-in is zero.

The following is an example of detection of an unreferred data latch-in operation. An updating flag is set for each register. The updating flag of the register is set when the data of that register is updated, that is, when the register refers to data of a register in the previous stage and stores the data inside thereof. The updating flag of each register is reset when the data stored inside the register is updated, that is, when the register in the next stage refers to this data and stores inside thereof.

Here, when the register under discussion refers to data of a register in the previous stage, if the reference flag of the register to be referred to, that is, the register in the previous stage, is not set, the register under discussion refers to unupdated data. Therefore, in this case, the number of times of the unupdated data latch-in of the register under discussion is increased by one. By contrast, when the register under discussion refers to data of a register in the previous stage, if the updating flag has been already set for the register to be referred to, the register under discussion stores inside thereof the updated data. Therefore, in this case, the number of times of the unupdated data latch-in of the register under discussion is not changed.

Calculation of Unnecessary Register Operation Occurring Period

The register b will be discussed. The time series that the data holding operation of the register b occurs (clock cycle) is {3, 4, 6, 10, 11}. The time series that the unreferred data latch-in operation occurs is {7, 12}. The time series that the unupdated data latch-in operation occurs is $\phi$ {null set, no elements}. When these three series are merged, the time series that the unnecessary register operation of the register b occurs is {3, 4, 6, 7, 10, 11, 12}. The time series that the unnecessary register operation occurs consecutively, obtained from this, is {3, 4}, {6, 7}, and {10, 11, 12}. The designer can understood that there are unnecessary register operations expanding over a maximum of three clock cycles.

As mentioned above, in the system 20 of the present embodiment, the unnecessary power consumption detecting section includes: a clock operation and data transfer time series storing section 71 for storing a time series that a signal propagation occurs between all two neighboring nodes in a circuit; an updating and reference time series calculating section 72 for calculating a sequence relation between the updating and reference of the value of each node from the time series of the signal propagations stored by the clock operation and data transfer time series storing section 71; an unreferred data latch-in frequency and time series calculating section 74 for calculating, from the sequence relation between the updating and reference of the value of each node calculated by the updating and reference time series calculating section 72, the number of times and time series that a signal propagation that is not necessarily required in an operation of the integrated circuit occurs; and an unupdated data latch-in frequency and time series calculating section 75.

The above configuration gives information how the circuit should be changed to reduce the power consumption of the circuit in the following manner.

First, the clock operation and data transfer time series storing section 71 stores a time series (periods) that a signal propagation occurs between all the two neighboring nodes (places) in the circuit to distinguish between data transfers that are necessary to an operation of the integrated circuit and those that are not necessary. An example of such a node is a register.

Next, the updating and reference time series calculating section 72 calculates the sequence relation between the updating and reference of the value of each node from the time series of the signal propagations stored as above, that is, calculates a time series that data of each node is updated and a time series that data of each node is referred to from the time series that the data transfer occurs.

Next, the unreferred data latch-in frequency and time series calculating section 74 and the unupdated data latch-in frequency and time series calculating section 75 calculate, from the sequence relation between the updating and reference of the value of each node calculated as above, the number of times and time series that a signal propagation that is not necessarily required in an operation of the integrated circuit occurs.

Then, the unnecessary power consumption detecting section calculates unnecessary power consumption, that is power consumption caused by the unnecessary signal propagation.

The unnecessary power consumption is calculated by analyzing time-related information, that is, time-related causes and results on a data transfer, such as the updating and reference of the value of each node, in this manner.

This, in addition to the effects produced by the configurations of the first embodiment, allows the designer to know in more detail where improvements can be made to reduce the power consumption of the circuit, and therefore makes it possible to take a more efficient measure to reduce the power consumption.

Moreover, as mentioned above, in the system 20, the updating and reference time series calculating section 72 obtains the sequence relation between the operation 1 and the operation 2 as the sequence relation between the updating and reference of the value of each node, the operation 1 being an operation of the register under discussion to update the data by storing inside thereof the result of processing dependent on the data of a register in the previous stage, and the operation 2 being an operation of a register in the next stage to update the data by referring to and storing inside thereof the result of processing dependent on the data of the register under discussion. The unreferred data latch-in frequency and time series calculating section 74 and the unupdated data latch-in frequency and time series calculating section 75 obtain the number of times and a time series of unreferred data latch-in operations, that are unnecessary data transfer operations of the register under discussion to store inside thereof data unreferred to by a register in the next stage, by obtaining, from the sequence relation obtained by the updating and reference time series calculating section 72, the number of times that a state in which the operation 1 is consecutively performed occurs.

The above configuration gives information as to how the circuit should be changed to reduce the power consumption of the circuit in the following manner.

First, the clock operation and data transfer time series storing section 71 stores a time series of signal propagations as above to distinguish between data transfers that are necessary to an operation of the circuit and those that are not necessary.

Next, the updating and reference time series calculating section 72 calculates, as the sequence relation between the updating and reference of the value of each node, that is, as a time series that data of each node is updated and a time series that data of each node is referred to, the sequence relation between the operation 1 for the register under discussion to update the data by storing inside thereof the result of processing dependent on the data of a register in the previous stage and the operation 2 for a register in the next stage to update the data by referring to and storing inside thereof the result of processing dependent on the data of the register under discussion.

Next, the unreferred data latch-in frequency and time series calculating section 74 and the unupdated data latch-in frequency and time series calculating section 75 obtain the number of times and time series of unreferred data latch-in operations, that are unnecessary data transfer operations of the register under discussion to store inside thereof data unreferred to by a register in the next stage, by obtaining, from the sequence relation obtained as above, the number of times that a state in which the operation 1 is consecutively performed occurs. In other words, the unreferred data latch-in frequency and time series calculating section 74 and the unupdated data latch-in frequency and time series calculating section 75 obtain the unreferred data latch-in frequency and the time series that an unreferred data latch-in occurs by detecting an operation in which updated data is updated consecutively before being referred to.

Then, the unnecessary power consumption detecting section detects, out of the power consumption by the operations of the register, the unnecessary and therefore reducible power consumption caused by an unnecessary signal propagation, i.e., the power unnecessarily consumed by storing, inside the register, data unreferred in the next stage.

The unnecessary power consumption is calculated by analyzing the sequence relation about operations to latch in unreferred data of a register in this manner as the sequence relation between the updating and reference of the value of each node. This, in addition to the effects produced by the configurations of the first embodiment, allows the designer to know in more detail where improvements can be made to reduce the power consumption of the circuit, and therefore makes it possible to take a more efficient measure to reduce the power consumption.

Moreover, as mentioned above, in the system 20, the updating and reference time series calculating section 72 obtains the sequence relation between the operation 1 and the operation 3 as the sequence relation between the updating and reference of the value of each node, the operation 1 being an operation of the register under discussion to update the data by storing inside thereof the result of processing dependent on the data of a register in the previous stage, and the operation 3 being an operation of a register in the previous stage that transfers data to the register under discussion to update the data by storing inside thereof the result of processing dependent on the data of a register in the previous stage of that previous stage. The unreferred data latch-in frequency and time series calculating section 74 and the unupdated data latch-in frequency and time series calculating section 75 obtain the number of times and time series of unupdated data latch-in operations, that are unnecessary data transfer operations of the register under discussion to store inside thereof the result of processing dependent on the data unupdated by a register in the previous stage, by obtaining, from the sequence relation obtained by the updating and reference time series calculating section 72, the number of times that a state in which the operation 1 is consecutively performed occurs.

The above configuration gives information how the circuit should be changed to reduce the power consumption of the circuit in the following manner.

First, the clock operation and data transfer time series storing section 71 stores a time series of signal propagations as above to distinguish between data transfers that are necessary to an operation of the circuit and those that are not necessary.

Next, the updating and reference time series calculating section 72 calculates, as the sequence relation between the updating and reference of the value of each node, that is, as a time series that data of each node is updated and a time series that data of each node is referred to, the sequence relation between the operation 1 for the register under discussion to update the data by storing inside thereof the result of processing dependent on the data of a register in the previous stage and the operation 3 for a register in the previous stage that transfers data to the register under discussion to update the data by storing inside thereof the result of processing dependent on the data of a register in the previous stage of that previous stage.

Next, the unreferred data latch-in frequency and time series calculating section 74 and the unupdated data latch-in frequency and time series calculating section 75 obtain the number of times and time series of unupdated data latch-in operations, that are unnecessary data transfer operations of the register under discussion to store inside thereof data unupdated by a register in the previous stage, the result of processing dependent on the data, and the like, by obtaining, from the sequence relation obtained as above, the number of times that a state in which the operation 1 is consecutively performed occurs. In other words, the unreferred data latch-in frequency and time series calculating section 74 and the unupdated data latch-in frequency and time series calculating section 75 obtain the unupdated data latch-in frequency and the time series that an unupdated data latch-in occurs by detecting an operation in which, a register refers to data of a register in the previous stage, and then refers to the data consecutively before the register in the previous stage is updated.

Then, the unnecessary power consumption detecting section detects, out of the power consumption by the operations of the register, the unnecessary and therefore reducible power consumption caused by an unnecessary signal propagation, i.e., power unnecessarily consumed by storing, inside the register, data unupdated in the previous stage.

The unnecessary power consumption is calculated by analyzing the sequence relation about operations to latch in unreferred data of a register in this manner as the sequence relation between the updating and reference of the value of each node. This, in addition to the effects produced by the configurations of the first embodiment, allows the designer to know in more detail where improvements can be made to reduce the power consumption of the circuit, and therefore makes it possible to take a more efficient measure to reduce the power consumption.

Moreover, as mentioned above, in the system 20, the updating and reference time series calculating section 72 obtains the sequence relation between the operation 1, the operation 2 and the operation 3 as the sequence relation between the updating and reference of the value of each node, the operation 1 being an operation of the register under discussion to update the data by storing inside thereof the result of processing dependent on the data of a register in the previous stage, the operation 2 being an operation of a register in the next stage to update the data by referring to and storing inside thereof the result of processing dependent on the data of the register under discussion, and the operation 3 being an operation of a register in the previous stage that transfers data to the register under discussion to update the data by storing inside thereof the result of processing dependent on the data of a register in the previous stage of that previous stage. The unreferred data latch-in frequency and time series calculating section 74 and the unupdated data latch-in frequency and time series calculating section 75 obtain the number of times and time series of unnecessary data transfer operations of the register under discussion to store inside thereof data unreferred to by a register in the next stage and the number of times and time series of unnecessary data transfer operations of the register under discussion to store inside thereof the result of processing dependent on the data unupdated by a register in the previous stage, by obtaining, from the sequence relation obtained by the updating and reference time series calculating section 72, the number of times that a state in which the operation 1 is consecutively performed occurs. In addition, the unnecessary power consumption detecting section includes a data holding operation time series calculating section 73 for obtaining, from the sequence relation obtained by the updating and reference time series calculating section 72, the number of times and time series for the register under discussion to carry out an operation to hold data, and an unnecessary register operation occurring period detecting section 76 for obtaining a sum-set of time periods of unreferred data latch-in operations, time periods of unupdated data latch-in operations, detected by the unreferred data latch-in frequency and time series calculating section 74 and the unupdated data latch-in frequency and time series calculating section 75, and time periods of the data holding operations detected by the data holding operation time series calculating section 73, and for obtaining a time series that the unnecessary register operation occurs consecutively from that sum-set.

The above configuration gives information how the circuit should be changed to reduce the power consumption of the circuit in the following manner.

First, the unreferred data latch-in frequency and time series calculating section 74 and the unupdated data latch-in frequency and time series calculating section 75 obtain the number of times and time series of unnecessary data transfer operations of the register under discussion to store inside thereof data unreferred to by a register in the next stage, and the number of times and time series of unnecessary data transfer operations of the register under discussion to store inside thereof data unupdated by a register in the previous stage, the result of processing dependent on the data, and the like, by obtaining the number of times that a state in which the operation 1 is consecutively performed occurs.

The data holding operation time series calculating section 73 obtains, from the sequence relation obtained by the updating and reference time series calculating section 72, the number of times and time series for the register under discussion to carry out an operation to hold data.

The unnecessary register operation occurring period detecting section 76 merges, that is, obtains a sum-set of, a time series of unreferred data latch-in operations, a time series of unupdated data latch-in operations, detected by the unreferred data latch-in frequency and time series calculating section 74 and the unupdated data latch-in frequency and time series calculating section 75, and a time series of the data holding operations detected by the data holding operation time series calculating section 73, and obtains a time series that the unnecessary register operation occurs consecutively from that sum-set.

The time periods when the unnecessary register operation consecutively occurs are obtained in this manner. This allows the information on the detected unnecessary operations to be processed so as to be useful to the designer in reducing the power consumption. That is, this, in addition to the effects produced by the configurations of the first embodiment, allows the designer to know the time periods when the clock operations for driving the registers can be stopped to reduce the power consumption, and therefore makes it possible to take a more efficient measure to reduce the power consumption.

In this manner, the configuration of the present embodiment, in addition to the effects produced by the configurations of the first embodiment, produces an effect of allowing the designer to know the time periods when the clock operations for driving the registers can be stopped to reduce the power consumption and therefore to know in more detail where improvements can be made to reduce the power consumption of the circuit, and makes it possible to take a more efficient measure to reduce the power consumption.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A system for detecting power consumption, comprising unnecessary power consumption detecting means for detecting, among signal transitions by elements of an integrated circuit, the number of times of a signal transition that is unnecessary to processing of said integrated circuit and for obtaining, for each of said elements, unnecessary power consumption that is power consumption caused by an unnecessary operation based on the number of times of the unnecessary signal transition.

2. The system for detecting power consumption as defined in claim 1,
wherein said unnecessary power consumption detecting means includes:
unnecessary circuit operation distinguishing means for detecting the number of times of the signal transition that is unnecessary to the processing of said integrated circuit by distinguishing the unnecessary signal transitions from necessary signal transitions; and
unnecessary power consumption calculating means for obtaining, for each of said elements, the unnecessary power consumption that is power consumption caused by the unnecessary operation from the number of times of the unnecessary signal transition, a load capacity and an operating voltage of each of the signals.

3. The system for detecting power consumption as defined in claim 1,
wherein said integrated circuit includes a plurality of registers as said elements,
wherein said unnecessary power consumption detecting means obtains the unnecessary power consumption for each of the registers.

4. The system for detecting power consumption as defined in claim 3,
wherein said unnecessary power consumption detecting means detects the number of times of an operation of each of the registers to hold the stored content thereof as the number of times of the unnecessary signal transition.

5. The system for detecting power consumption as defined in claim 3,
wherein said unnecessary power consumption detecting means detects the number of times of an operation of each of the registers to store data that is not referred to by a register in a next stage as the number of times of the unnecessary signal transition.

6. The system for detecting power consumption as defined in claim 3,
wherein said unnecessary power consumption detecting means detects the number of times of an operation of each of the registers to store data that is not updated by a register in a previous stage as the number of times of the unnecessary signal transition.

7. The system for detecting power consumption as defined in claim 1,
wherein said unnecessary power consumption detecting means further includes time-measuring means for determining the time since detection is started,
wherein said unnecessary power consumption detecting means obtains the number of times of the unnecessary signal transition per unit time.

8. The system for detecting power consumption as defined in claim 3,
wherein said unnecessary power consumption detecting means includes result output means for outputting a name and calculated reducible power consumption of each of the registers.

9. The system for detecting power consumption as defined in claim 1,
wherein said unnecessary power consumption detecting means is arranged to calculate power consumption of the whole integrated circuit.

10. The system for detecting power consumption as defined in claim 3,
wherein said unnecessary power consumption detecting means includes:
register transfer condition satisfying frequency calculating means for obtaining, from a control condition when data is transferred to a register, the number of times that a register transfer condition that is true if a register under discussion stores inside thereof a result of processing dependent on data of a register in a previous stage is satisfied;
data holding operation frequency calculating means for obtaining, from the number of times that the register transfer condition is satisfied, the number of times of a data holding operation of the register under discussion to hold data thereof; and
unnecessary power consumption calculating means for calculating, from the number of times of the data holding operation, power consumption of the data holding operation as the unnecessary power consumption out of power consumption of all operations of the register.

11. The system for detecting power consumption as defined in claim 3,
wherein said unnecessary power consumption detecting means includes:
register transfer condition satisfying frequency calculating means for obtaining, from a control condition when data is transferred to a register, the number of times that a register transfer condition that is true if a register under discussion stores inside thereof a result of processing dependent on data of a register in a previous stage is satisfied;

next-stage register reference condition satisfying frequency calculating means for obtaining the number of times that a next-stage register reference condition that is true if a register in a next stage stores inside thereof a result of processing dependent on data of the register under discussion is satisfied;

unreferred data latch-in frequency calculating means for obtaining, from the number of times that the register transfer condition is satisfied and the number of times that the next-stage register reference condition is satisfied, the number of times of an unreferred data latch-in operation of the register under discussion to store inside thereof data that is not referred to by the register in the next stage; and unnecessary power consumption calculating means for calculating, from the number of times of the unreferred data latch-in operation, power consumed by storing data that is not referred to in the next stage as the unnecessary power consumption out of power consumption of all operations of the register.

12. The system for detecting power consumption as defined in claim 3, wherein said unnecessary power consumption detecting means includes:

register transfer condition satisfying frequency calculating means for obtaining, from a control condition when data is transferred to a register, the number of times that a register transfer condition that is true if a register under discussion stores inside thereof a result of processing dependent on data of a register in a previous stage is satisfied;

previous-stage register updating condition satisfying frequency calculating means for obtaining the number of times that a previous-stage register updating condition that is true if the register in the previous stage stores inside thereof a result of processing dependent on data of a register in a previous stage of that previous stage is satisfied;

unupdated data latch-in frequency calculating means for obtaining, from the number of times that the register transfer condition is satisfied and the number of times that the previous-stage register updating condition is satisfied, the number of times that the data of the register in the previous stage of the register under discussion is updated, and for obtaining, from this number of times, the number of times of an unupdated data latch-in operation of the register under discussion to store inside thereof a result of processing dependent on data that is not updated by the register in the previous stage; and unnecessary power consumption calculating means for calculating, from the number of times of the unupdated data latch-in operation, power consumed by storing the data that is not updated in the previous stage as the unnecessary power consumption out of power consumption of all operations of the register.

13. The system for detecting power consumption as defined in claim 1, wherein said unnecessary power consumption detecting means includes unnecessary propagation detecting means for obtaining, for each of said elements, the number of times and a time series that a signal propagation that is unnecessary to operations of said integrated circuit occurs.

14. The system for detecting power consumption as defined in claim 1, wherein said integrated circuit includes a plurality of nodes, where in said unnecessary power consumption detecting means includes:

signal propagation time series storing means for storing a time series that a signal propagation occurs between all two neighboring nodes in said integrated circuit;

sequence relation detecting means for obtaining a sequence relation between the updating and reference of the value of each of the nodes from the time series of the signal propagations stored by said signal propagation time series storing means; and unnecessary propagation detecting means for obtaining, for each of the nodes from the sequence relation of the updating and reference of the value of each of the nodes obtained by said sequence relation detecting means, the number of times and a time series that a signal propagation that is unnecessary to operations of said integrated circuit occurs.

15. The system for detecting power consumption as defined in claim 14, wherein said integrated circuit includes a plurality of registers as said elements.

16. The system for detecting power consumption as defined in claim 15, wherein said sequence relation detecting means obtains a sequence relation of a first operation and a second operation as the sequence relation between the updating and reference of the value of each of the nodes, the first operation being an operation of a register under discussion to update data thereof by storing inside thereof a result of processing dependant on data of a register in a previous stage, the second operation being an operation of a register in a next stage to update data thereof by referring to and storing inside thereof a result of processing dependent on the data of the register under discussion, wherein said unnecessary propagation detecting means obtains, from the sequence relation obtained by said sequence relation detecting means, the number of times that a state in which the first operation is carried out consecutively occurs, and obtains, from the number of times of the occurrence, the number of times and a time series of an unreferred data latch-in operation of the register under discussion to store inside thereof data that is not referred to by the register in the next stage as the number of times and the time series that the unnecessary signal propagation occurs.

17. The system for detecting power consumption as defined in claim 15, wherein said sequence relation detecting means obtains a sequence relation of a first operation and a second operation as the sequence relation between the updating and reference of the value of each of the nodes, the first operation being an operation of a register under discussion to update data thereof by storing inside thereof a result of processing dependant on data of a register in a previous stage, the second operation being an operation of the register in the previous stage that transfers the data thereof to the register under discussion to update the data thereof by storing inside thereof a result of processing dependent on data of a register in a previous stage of that previous stage, wherein said unnecessary propagation detecting means obtains, from the sequence relation obtained by said sequence relation detecting means, the number of times that a state in which the first operation is carried out consecutively occurs, and obtains, from the number of times of the occurrence, the number of times and a time series of an unupdated data latch-in operation of the register under discussion to store inside thereof a result of processing dependent on data that is not updated by the register in the previous stage as the number of times and the time series that the unnecessary signal propagation occurs.

18. The system for detecting power consumption as defined in claim 15, wherein said sequence relation detecting means obtains a sequence relation of a first operation, a second operation and a third operation as the sequence relation between the updating and reference of the value of each of the nodes, the first operation being an operation of a register under discussion to update data thereof by storing inside thereof a result of processing dependant on data of a register in a previous stage, the second operation being an operation of a register in a next stage to update data thereof by referring to and storing inside thereof a result of processing dependent on the data of the register under discussion, the third operation being an operation of the register in the previous stage that transfers the data thereof to the register under discussion to update the data thereof by storing inside thereof a result of processing dependent on data of a register in a previous stage of that previous stage, wherein said unnecessary propagation detecting means obtains, from the sequence relation obtained by said sequence relation detecting means, the number of times that a state in which the first operation is carried out consecutively occurs, and obtains, from the number of times of the occurrence, the number of times and a time series of an unnecessary data transfer operation of the register under discussion to store inside thereof data that is not referred to by the register in the next stage, and the number of times and a time series of an unnecessary data transfer operation of the register under discussion to store inside thereof a result of processing dependent on data that is not updated by the register in the previous stage, wherein said unnecessary power consumption detecting means includes:

data holding detecting means for obtaining, from the sequence relation obtained by said sequence relation detecting means, the number of times and a time series of the register under discussion to carry out an operation to hold the data; and unnecessary operation period detecting means for obtaining a sum-set of the time period of an unreferred data latch-in operation detected by said unnecessary propagation detecting means, the time period of an unupdated data latch-in operation, and the time period of the data holding operations detected by the data holding detecting means, and for obtaining, from that sum-set, a time series that an unnecessary register operation occurs consecutively.

19. A recording medium storing a computer program for detecting the number of times of a signal transition that is unnecessary to processing of an integrated circuit among all signal transitions of each element of said integrated circuit, and for obtaining, based on the number of times of the unnecessary signal transition, unnecessary power consumption that is power consumption caused by an unnecessary operation for each of the elements.

20. A method for detecting power consumption, comprising the steps of:

(1) detecting the number of times of a signal transition that is unnecessary to processing of an integrated circuit among all signal transitions of each element of said integrated circuit, and (2) obtaining, based on the number of times of the unnecessary signal transition, power consumption caused by an unnecessary operation for each of said elements.

21. The system for detecting power consumption as defined in claim 1, wherein said unnecessary power consumption detecting means detects the number of times of a signal transition per element, and obtains the unnecessary power consumption for each element so as to identify an element of unnecessary power consumption.

22. The recording medium storing a computer program as defined in claim 19, wherein said computer program detects the number of times of a signal transition per element, and obtains the unnecessary power consumption for each element so as to identify an element of unnecessary power consumption.

23. The method as defined in claim 20, wherein said step (1) detects the number of times of a signal transition per element, and said step (2) obtains the unnecessary power consumption for each element so as to identify an element of unnecessary power consumption.

24. A system for detecting power consumption of an integrated circuit having a plurality of elements, said system comprising:

an unnecessary circuit operation distinguishing section configured to distinguish between necessary operations and unnecessary operations for each of the elements of the integrated circuit; and an unnecessary power consumption calculating section configured to calculate the unnecessary power consumption of each element in the integrated circuit based on the number of unnecessary operations, a load capacity and an operating voltage for each element.

25. The system for detecting power consumption as defined in claim 24, wherein the elements of the integrated circuit comprise registers.

26. The system for detecting power consumption as defined in claim 25, wherein the unnecessary operations include operations for holding stored data content of said registers.

27. The system for detecting power consumption as defined in claim 25, wherein the unnecessary operations include operations for storing data in ones of said registers, the stored data being data that is not referred to by any registers in a subsequent stage of the integrated circuit.

28. The system for detecting power consumption as defined in claim 25, wherein the unnecessary operations include operations for storing data in ones of said registers, the stored data being data that is not updated by any registers in a previous stage of the integrated circuit.

29. The system for detecting power consumption as defined in claim 24, wherein a power consumption calculating section is configured to calculate the power consumption of each element in the integrated circuit based on the number of unnecessary operations per unit time.

30. The system for detecting power consumption as defined in claim 24, further comprising:

an output section configured to output an identifier and the calculated power consumption for each element in the integrated circuit.

31. The system for detecting power consumption as defined in claim 24, wherein said power consumption calculating section is further configured to calculate the power consumption of the whole integrated circuit.

32. The system for detecting power consumption as defined in claim 24, wherein the elements of the integrated circuit comprise registers and the unnecessary operations comprise one or more operations associated with the registers.

33. The system for detecting power consumption as defined in claim 32, wherein the unnecessary operations comprise operations for holding data in said registers, operations for storing data in ones of said registers, the stored data being data that is not referred to by any other registers, and operations for storing unupdated data in said registers.

34. The system for detecting power consumption as defined in claim 24, wherein said unnecessary circuit operation distinguishing section is further configured to distinguish between necessary data transfers and unnecessary data transfers for each pair of neighboring nodes of the integrated circuit, and said unnecessary power consumption calculating section is further configured to calculate an unnecessary power consumption of the integrated circuit due to the unnecessary data transfers.

35. A system for detecting power consumption of an integrated circuit having a plurality of elements, said system comprising:

an unnecessary circuit operation distinguishing section configured to distinguish between necessary data transfers and unnecessary data transfers for each pair of neighboring nodes of the integrated circuit; and an unnecessary power consumption calculating section configured to calculate the unnecessary power consumption of the integrated circuit due to the unnecessary data transfers.

* * * * *